(12) United States Patent
Yajima

(10) Patent No.: US 9,806,049 B2
(45) Date of Patent: Oct. 31, 2017

(54) SEMICONDUCTOR DEVICE

(71) Applicant: Renesas Electronics Corporation, Tokyo (JP)

(72) Inventor: Akira Yajima, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/271,405

(22) Filed: Sep. 21, 2016

(65) Prior Publication Data
US 2017/0092609 A1    Mar. 30, 2017

(30) Foreign Application Priority Data

Sep. 30, 2015   (JP) ................. 2015-193117

(51) Int. Cl.
*H01L 23/495*   (2006.01)
*H01L 23/00*   (2006.01)

(52) U.S. Cl.
CPC .............. *H01L 24/14* (2013.01); *H01L 24/13* (2013.01); *H01L 24/16* (2013.01); *H01L 2224/10126* (2013.01); *H01L 2224/13024* (2013.01); *H01L 2224/13111* (2013.01); *H01L 2224/13139* (2013.01); *H01L 2224/13147* (2013.01); *H01L 2224/14135* (2013.01); *H01L 2224/14179* (2013.01); *H01L 2224/14517* (2013.01); *H01L 2224/16238* (2013.01); *H01L 2924/0133* (2013.01); *H01L 2924/07025* (2013.01); *H01L 2924/351* (2013.01)

(58) Field of Classification Search
CPC ................................ H01L 23/13; H01L 24/06
See application file for complete search history.

(56) References Cited

U.S. PATENT DOCUMENTS

| | | | |
|---|---|---|---|
| 6,656,828 B1 | 12/2003 | Maitani et al. | |
| 2002/0195718 A1* | 12/2002 | Imasu | H01L 21/563 257/778 |
| 2010/0130000 A1* | 5/2010 | Sutou | H01L 24/11 438/612 |
| 2013/0026623 A1* | 1/2013 | Chen | H01L 23/16 257/737 |

FOREIGN PATENT DOCUMENTS

| | | |
|---|---|---|
| JP | 2014-229623 A | 12/2014 |
| WO | 00/44043 A1 | 7/2000 |

* cited by examiner

*Primary Examiner* — Samuel Gebremariam
(74) *Attorney, Agent, or Firm* — Mattingly & Malur, PC

(57) ABSTRACT

In the semiconductor device, a bump electrode which connects a semiconductor chip and a wiring board is made up of a first part surrounded by an insulating film and a second part exposed from the insulating film. Since it is possible to reduce a width of the bump electrode while increasing a height of the bump electrode, a distance between the neighboring bump electrodes can be increased, and a filling property of a sealing material can be improved.

14 Claims, 18 Drawing Sheets

SEMICONDUCTOR DEVICE

CROSS-REFERENCE TO RELATED APPLICATION

The present application claims priority from Japanese Patent Application No. 2015-193117 filed on Sep. 30, 2015, the content of which is hereby incorporated by reference into this application.

TECHNICAL FIELD OF THE INVENTION

The present invention relates to a semiconductor device, for example, a technique effectively applied to a semiconductor device including a semiconductor chip having a rewiring (rearrangement wiring).

BACKGROUND OF THE INVENTION

Japanese Patent Application Laid-Open Publication No. 2014-229623 (Patent Document 1) discloses a technique in which an electrode pad formed on a surface of a semiconductor chip and a lead electrode of a wiring board are connected via a Cu pillar.

International Publication No. 00/44043 (Patent Document 2) discloses a technique in which bonding pads arranged in a peripheral portion of a semiconductor chip and bump electrodes arranged in an entire chip surface area are connected by rearrangement wiring. It further discloses a chip size package in which a semiconductor chip having bump electrodes arranged on a surface thereof is connected onto a mounting board by face-down bonding, and a gap between the semiconductor chip and the mounting board is filled with underfilling resin.

SUMMARY OF THE INVENTION

The Cu pillar of the Patent Document 1 is a technique capable of coping with an increase of the number of pins (increase of the number of terminals) and a narrower pitch between terminals accompanying an increase of the integration degree of the semiconductor chip. However, the bump electrode made of solder of Patent Document 2 or the like is used in the field of automotive electronics where high reliability is required.

In addition, a screen printing method, an electrolytic plating method, a solder ball supply method and the like may be used as a method of forming the bump electrode.

A bump electrode obtained by the solder ball supply method with excellent controllability of a height of the bump electrode is used also in a semiconductor device that the inventor of the present application has studied, but the following problems have been found out through the studies by the inventor of the present application.

First, stress is applied to the bump electrode that connects a semiconductor chip and a mounting board due to a difference in coefficient of expansion therebetween, and thus, connection failure such as disconnection of the connecting portion (bump electrode) occurs. In order to prevent such failure, for example, it is necessary to increase the height of the bump electrode by using a solder ball with a large diameter. In such a case, however, since a space between the neighboring bump electrodes is decreased, avoid (unfilled portion) is generated when a gap between the bump electrodes is filled with underfilling resin, so that the disconnection of the connecting portion or the like occurs and the connection reliability is deteriorated. In addition, the above-described problems become more significant when the pitch between terminals becomes narrower along with an increase of the number of pins.

Namely, there is a demand for the improvement in reliability in the semiconductor device including the bump electrode.

The other problem and novel characteristics of the present invention will be apparent from the description of the present specification and the accompanying drawings.

In a semiconductor device according to one embodiment, a bump electrode which connects a semiconductor chip and a wiring board is made up of a first part whose periphery is surrounded by an insulating film and a second part exposed from the insulating film.

According to one embodiment, it is possible to improve the reliability of the semiconductor device.

BRIEF DESCRIPTIONS OF THE DRAWINGS

DESCRIPTIONS OF THE PREFERRED EMBODIMENTS

Figure 1:
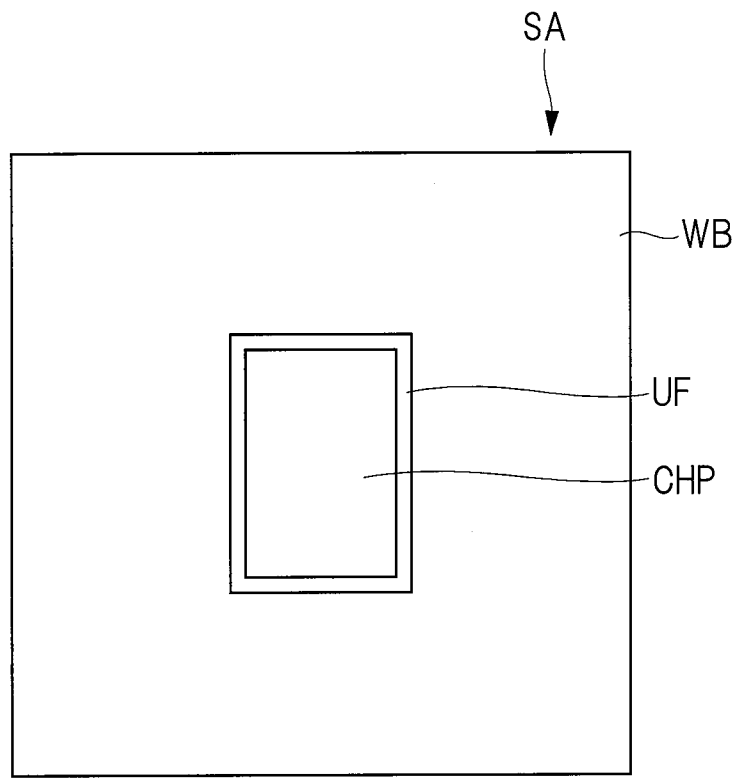
FIG. 1 is a top view of a semiconductor device according to an embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, the same components are denoted by the same reference characters in principle throughout the drawings for describing the embodiments, and the repetitive description thereof is omitted. Note that hatching is used in some cases even in a plan view so as to make the drawings easy to see.

Embodiment

Structure of Semiconductor Device

Figure 2:
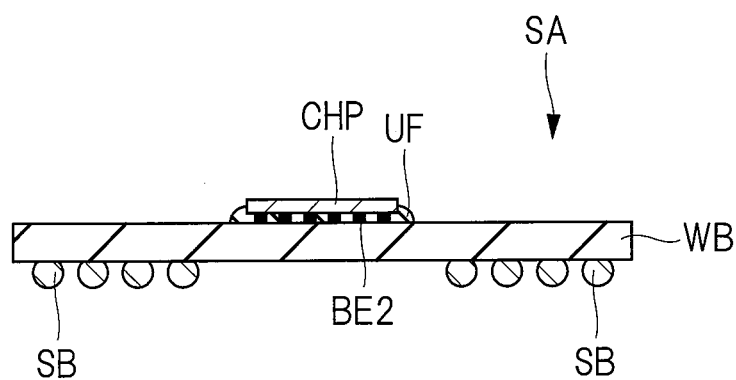
FIG. 2 is a side view of the semiconductor device according to the embodiment.
Figure 3:
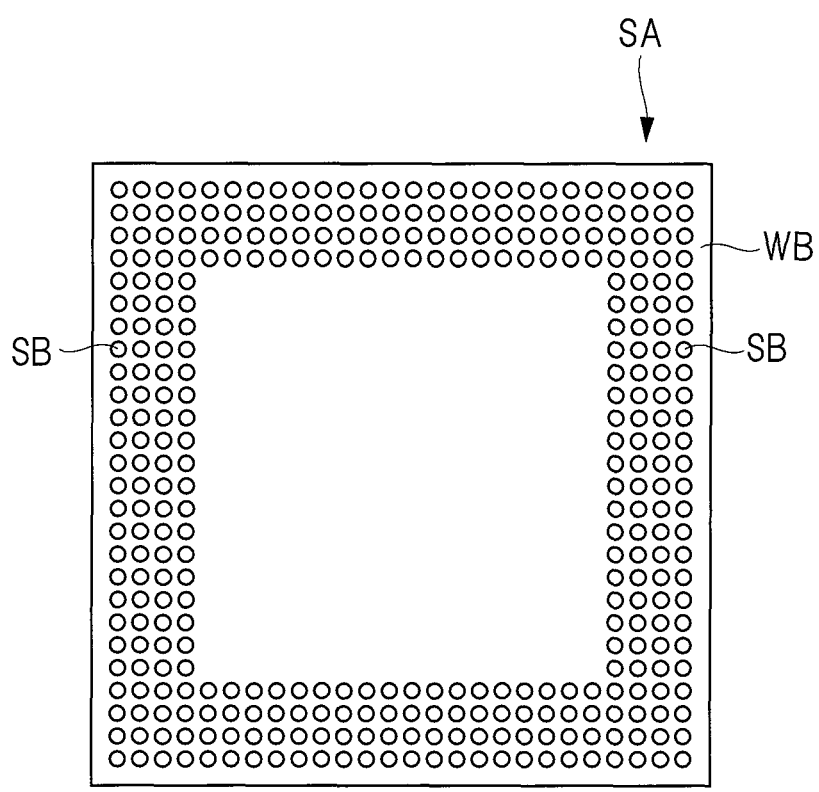
FIG. 3 is a bottom view of the semiconductor device according to the embodiment.
Figure 4:
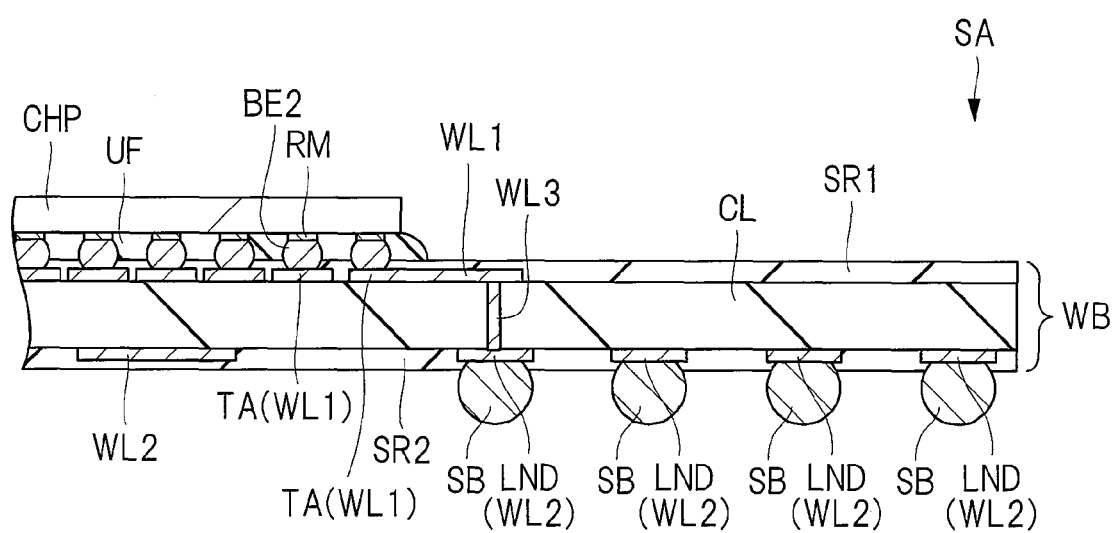
FIG. 4 is a partial cross-sectional view of the semiconductor device according to the embodiment.
Figure 5:
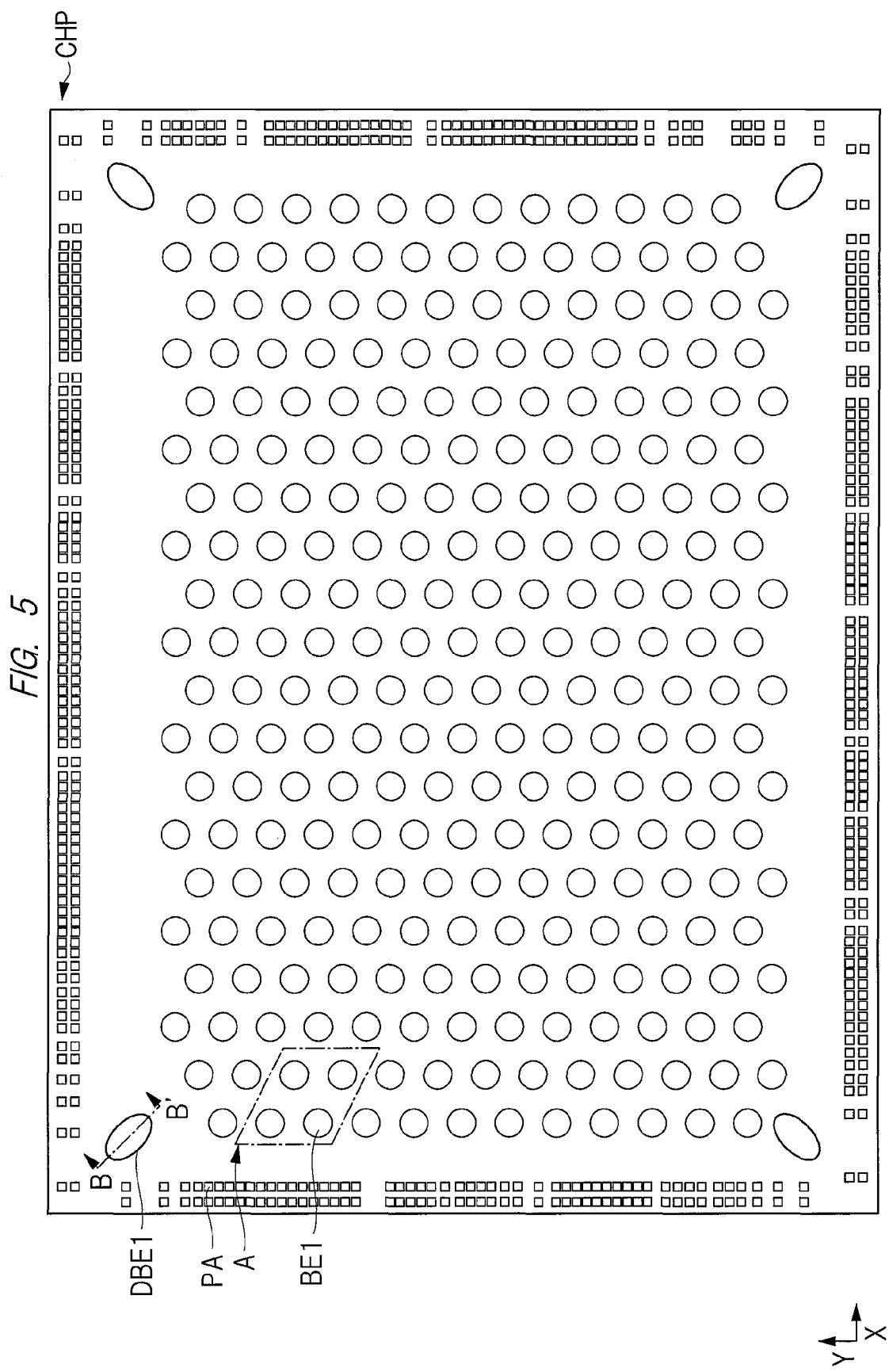
FIG. 5 is a plan view of a semiconductor chip according to the embodiment.
Figure 6:
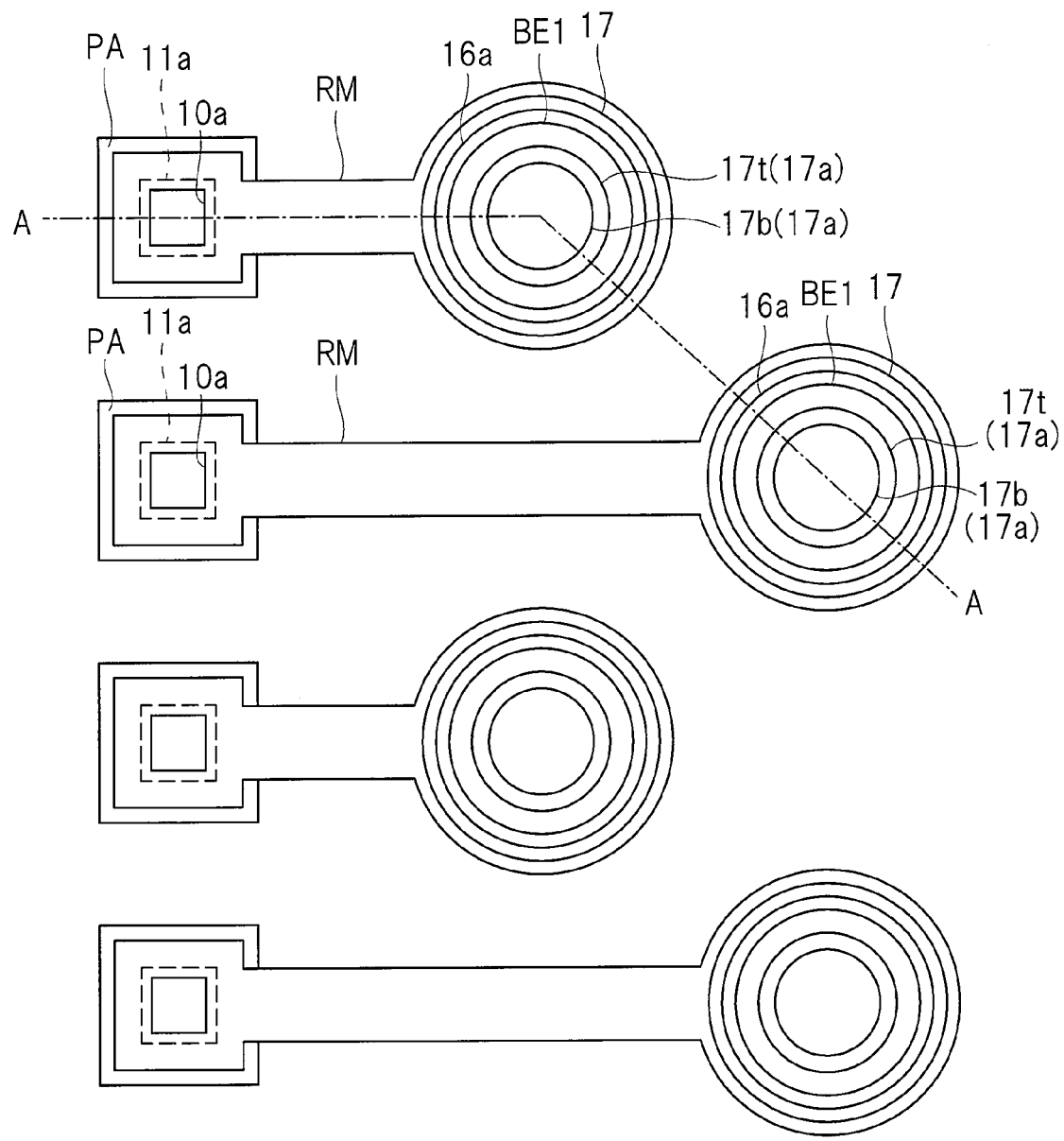
FIG. 6 is an enlarged plan view of a section A in FIG. 5.
Figure 7:
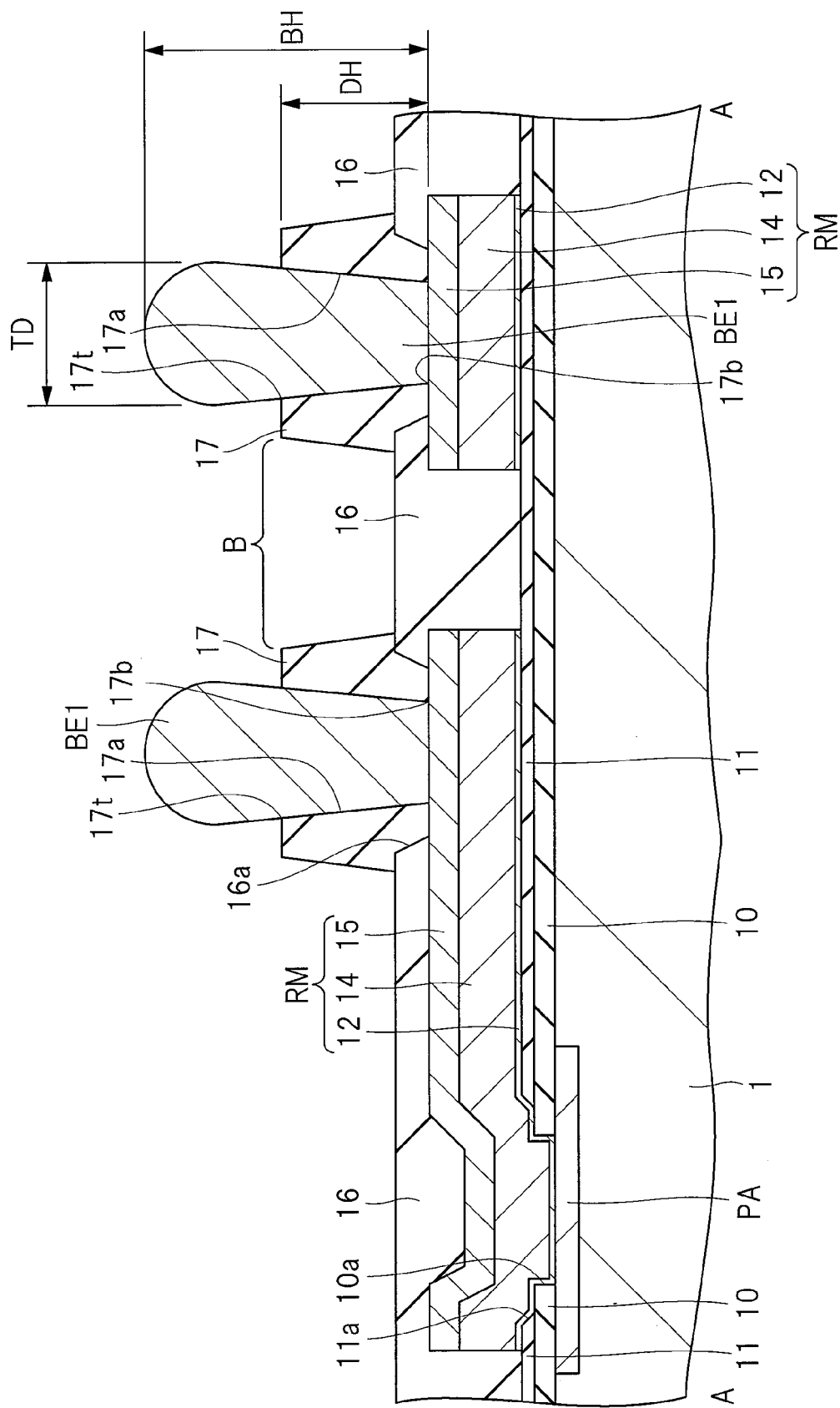
FIG. 7 is a cross-sectional view taken along a line A-A in FIG. 6.

FIG. 1 is a top view of a semiconductor device according to an embodiment. FIG. 2 is a side view of the semiconductor device according to the embodiment. FIG. 3 is a bottom view of the semiconductor device according to the embodiment. FIG. 4 is a partial cross-sectional view of the semiconductor device according to the embodiment. FIG. 5 is a plan view of a semiconductor chip according to the embodiment. FIG. 6 is an enlarged plan view of a section A in FIG. 5. FIG. 7 is a cross-sectional view taken along a line A-A in FIG. 6.

As shown in FIG. 1, a semiconductor device SA according to the embodiment includes a wiring board WB having a rectangular shape (for example, a square shape), and a semiconductor chip CHP having, for example, a rectangular shape is mounted on a center portion of the wiring board WB via a sealing material (underfill) UF. As shown in FIG. 1, a size of the semiconductor chip CHP is smaller than a size of the wiring board WB.

Next, the semiconductor device SA according to the embodiment includes the wiring board WB, and a plurality of solder balls SB for board (board solder balls SB) are formed on a rear surface (bottom surface) of the wiring board WB as shown in FIG. 2. Meanwhile, the semiconductor chip CHP is mounted on a front surface (main surface, upper surface) of the wiring board WB, and a plurality of bump electrodes BE2 are formed on the semiconductor chip CHP. A height of the bump electrode BE2 is, for example, about 40 µm to 200 µm. Further, the semiconductor chip CHP and the wiring board WB are electrically connected to each other through these bump electrodes BE2. As shown in FIG. 2, a gap between the semiconductor chip CHP and the wiring board WB due to the presence of the bump electrodes BE2 is filled with the sealing material UF. The sealing material UF is in contact with a main surface of the semiconductor chip CHP, the front surface of the wiring board WB and side surfaces (surfaces) of the bump electrodes BE2.

Next, as shown in FIG. 3, the plurality of board solder balls SB are arranged in an array form on the rear surface of the wiring board WB. FIG. 3 shows an example in which the board solder balls SB are arranged in four lines along an outer peripheral portion (outer edge portion) of the wiring board WB. These board solder balls SB function as external connection terminals for connecting the semiconductor device SA with an external device. Namely, the board solder ball SB is used for, for example, mounting the semiconductor device SA onto a circuit board typified by a motherboard.

FIG. 4 is a partial cross-sectional view of the semiconductor device SA according to the embodiment. Although the wiring board WB has a multilayer wiring structure, FIG. 4 shows only each single layer of a core layer CL, a wiring WL1 on the front surface of the core layer CL and a wiring WL2 on the rear surface of the core layer CL. An upper surface and a side surface of the wiring WL1 formed on the front surface of the core layer CL are coated with a solder resist film SR1. A terminal TA formed in a part of the wiring WL1 is exposed from the solder resist film SR1 through an opening provided in the solder resist film SR1, and the bump electrode BE2 is connected to the terminal TA in the opening. An upper surface and a side surface of the wiring WL2 formed on the rear surface of the core layer CL are coated with a solder resist film SR2. A land LND formed in a part of the wiring WL2 is exposed from the solder resist film SR2 through an opening provided in the solder resist film SR2, and the board solder ball SB is connected to the land LND in the opening. The wiring WL1 on the front surface is connected to the wiring WL2 on the rear surface through a wiring WL3 provided in a via penetrating the core layer CL. The solder resist films SR1 and SR2 are insulating films made of insulating resin, and the core layer CL is made of a resin board including an insulating layer made of, for example, glass epoxy resin.

The semiconductor chip CHP is mounted on the wiring board WB, and the bump electrode BE2 connected to a rewiring (rearrangement wiring) RM formed on the main surface of the semiconductor chip CHP is connected to the terminal TA exposed from the solder resist film SR1. Further, the gap between the semiconductor chip CHP and the wiring board WB is filled with the sealing material UF. Namely, the semiconductor chip CHP is mounted on the front surface of the wiring board WB with the bump electrode BE2 interposed therebetween so that the main surface of the semiconductor chip CHP opposes the front surface of the wiring board WB. Further, a gap between the main surface of the semiconductor chip CHP and the front surface of the wiring board WB is completely filled with the sealing material UF, and each gap among the plurality of bump electrodes BE2 is also completely filled with the sealing material UF. In other words, a sidewall (side surface, surface) of the bump electrode BE2 is in contact with the sealing material UF over the whole circumference. The sealing material UF is provided in order to, for example, mitigate stress applied to a bonding portion between the bump electrode BE2 and the terminal TA, and is made of an insulating resin film such as epoxy resin.

Pad electrodes PA are arranged in two lines on the main surface of the semiconductor chip CHP shown in FIG. 5 along a peripheral edge portion thereof. The pad electrodes PA are arranged in two lines along each of two long sides and two short sides of the rectangular main surface, so that two annular rows of the pad electrodes PA are configured. Further, a plurality of bump electrodes BE1 are arranged in a matrix form in the X direction and the Y direction on an inner side of the annular row of the pad electrodes PA, and a group of the bump electrodes BE1 is formed as a whole. The plurality of bump electrodes BE1 each having a circular shape are arranged at an equal pitch in the X direction or the Y direction, and the bump electrodes BE1 in neighboring lines are arranged in a zigzag manner. All the circles of FIG. 5 represent the bump electrodes BE1.

In addition, dummy bump electrodes DBE1 are arranged at corner portions of the semiconductor chip CHP in a region on an outer side of the group of the bump electrodes BE1 arranged in the matrix form. The elliptical dummy bump electrode DBE1 is arranged at each of the corner portions of the semiconductor chip CHP, and a long axis thereof substantially matches a direction of the diagonal line of the semiconductor chip CHP. In other words, the long axis of the dummy bump electrode DBE1 is directed to the corner portion of the semiconductor chip CHP. The four ellipses of FIG. 5 represent the dummy bump electrodes DBE1.

Each of the pad electrodes PA and the bump electrodes BE1 is connected to each other via the rewiring RM (not illustrated), and the rewiring RM extends from the peripheral edge portion of the semiconductor chip CHP toward the center. Namely, the pad electrodes PA arranged in the peripheral edge portion of the semiconductor chip CHP are re-arranged to the bump electrodes BE1 arranged in the center area of the semiconductor chip CHP by the rewiring RM. A pitch between the neighboring bump electrodes BE1 is larger than a pitch between the neighboring pad electrodes PA. Each of the pitch between the neighboring bump electrodes BE1 and the pitch between the neighboring pad electrodes PA mentioned here are those having a minimum value. By increasing the pitch between the bump electrodes BE1 which function as external connection terminals of the semiconductor chip CHP, the above-described connection with the wiring board WB is facilitated.

FIG. 6 shows the four bump electrodes BE1 of a section A of FIG. 5. As shown in FIG. 6, the pad electrode PA is connected to the bump electrode BE1 via the rewiring RM. Namely, one end of the rewiring RM is connected to the pad electrode PA via openings 10a and 11a, and the other end thereof is connected to the bump electrode BE1 via openings 16a and 17a. The other end (end portion) of the rewiring RM at which the bump electrode BE1 is arranged has a circular region (bump electrode mounting portion) having a diameter larger than a diameter of the bump electrode BE1, and the whole (whole region) of the bump electrode BE1 is arranged inside this circular region. In other words, the bump electrode BE1 is arranged on the rewiring RM, and does not protrude from the rewiring RM.

FIG. 7 shows a cross-sectional view taken along a line A-A of FIG. 6. As shown in FIG. 7, the pad electrode PA is formed on the semiconductor substrate 1, a surface protective film 10 and a protective film 11 are formed on the semiconductor substrate 1 and the pad electrode PA. The surface protective film 10 and the protective film 11 have the openings 10a and 11a that expose a part of the pad electrode PA, respectively. The opening 11a has a larger diameter than that of the opening 10a and opens the whole region of the opening 10a.

The pad electrode PA is configured of a conductor film made of, for example, an aluminum film, an aluminum alloy film (an AlSi film, an AlCu film, an AlSiCu film or the like) or a copper film. When the pad electrode PA is formed of an aluminum film or an aluminum alloy film, a metal barrier film may be provided on and under the aluminum film or the aluminum alloy film. For example, the pad electrode PA may have a stacked structure of a Ti film/a TiN film/an AlCu film/a TiN film formed in this order from a bottom layer thereof. In addition, when the pad electrode PA is formed of a copper film, a metal barrier film may be provided under the copper film and an insulating barrier film may be provided on the copper film. For example, the pad electrode PA may have a stacked structure of a TaN film/a Cu film/a SiCN film formed in this order from a bottom layer thereof.

The surface protective film 10 is made of an inorganic insulating film, and is configured of, for example, a silicon oxide film, a silicon nitride film or a stacked film thereof. Meanwhile, when the surface protective film 10 is made of the stacked film, a silicon oxide film and a silicon nitride film are stacked in this order from a bottom layer thereof. It is preferable that a film thickness of the surface protective film 10 is, for example, 1 μm or less.

The protective film 11 is made of an organic insulating film, and is configured of, for example, a polyimide film having a film thickness of about 3 to 5 μm. The protective film 11 has a stress mitigating function to prevent the stress applied to the bump electrode BE1 and the rewiring RM from being propagated to the surface protective film 10 and the like.

As shown in FIG. 7, the rewiring RM is formed on the surface protective film 10 and the protective film 11, and the rewiring RM is in contact and connected with the pad electrode PA through the openings 10a and 11a of the surface protective film 10 and the protective film 11. The rewiring RM is configured of a stacked film including a metal barrier film 12 and plating films 14 and 15, and the metal barrier film 12 and the plating films 14 and 15 have the same shape when seen in a plan view. The metal barrier film 12 is configured of a stacked film including, for example, a titanium (Ti) film, a titanium nitride (TiN) film and a titanium (Ti) film formed in this order from the bottom, and film thicknesses thereof are 10 nm, 50 nm and 10 nm, respectively. The plating film 14 is made of a copper film and has a film thickness of about 5 to 20 μm, and the plating film 15 is made of a nickel film and has a film thickness of 2 to 3 μm. In addition, a titanium (Ti) film, a titanium nitride (TiN) film, a titanium tungsten (TiW) film, a chromium (Cr) film, a tantalum (Ta) film, a tungsten (W) film, a tungsten nitride (WN) film, a high-melting-point metal film or a noble metal film (Pd, Ru, Pt, Ni or the like) may be used as the metal barrier film 12. The rewiring RM can be referred to also as a conductive layer (a conductive film or a wiring conductive layer) connected to the pad electrode PA.

The rewiring RM is a wiring having an extremely low resistance, and has a film thickness larger (greater) than the film thickness of the pad electrode PA. Further, it is preferable that the film thickness of the rewiring RM is at least five to ten times larger than the film thickness of the pad electrode PA or more. In addition, an interval between the neighboring rewirings RM is larger than an interval between the neighboring pad electrodes PA as shown in FIG. 6.

In addition, a main surface and a side surface of the rewiring RM are covered with a protective film 16. As shown in FIG. 7, the protective film 16 is interposed between the neighboring rewirings RM, and a gap between the neighboring rewirings RM is filled with the protective film 16. In other words, the neighboring rewirings RM are physically or electrically isolated from each other by the protective film 16. The opening 16a which exposes a part of the main surface (upper surface) of the rewiring RM is formed in the protective film 16. It is important that the protective film 16 covers the main surface and the side surface of the rewiring RM so as not to expose a shoulder portion and the like of the rewiring RM, and the protective film 16 is made of an organic insulating film, for example, a polyimide film and has a film thickness of 5 to 8 μm.

The bump electrode BE1 is connected to the rewiring RM inside the opening 16a provided in the protective film 16. The bump electrode BE1 is made of, for example, alloy of tin, silver and copper (for example, Sn-1.0Ag-0.5Cu), or may be made of alloy of tin and silver (for example, Sn-1.5Ag).

In addition, an insulating film 17 made of an organic insulating film, for example, a polyimide film is formed around the bump electrode BE1. A film thickness of the insulating film 17 is, for example, 25 to 30 μm. The insulating film 17 is formed so as to be in contact with the bump electrode BE1 and have a predetermined width to cover the periphery of the bump electrode BE1. Namely, the insulating film 17 is selectively formed on the protective film 16 so as to cover the periphery of the bump electrode BE1, and a region B in which the insulating film 17 is not formed and the protective film 16 is exposed is present between the neighboring bump electrodes BE1. The insulating film 17 includes the circular opening 17a that exposes the surface of the rewiring RM, and an upper end and a lower end of the opening 17a are referred to as an opening 17t and an opening 17b, respectively. A sidewall of the opening 17a has a tapered shape, and a diameter of the opening 17t is larger than a diameter of the opening 17b. The bump electrode BE1 is in contact with the rewiring RM in the opening 17b. Though not illustrated, a gold film or a stacked film including a gold film and a palladium film (having a structure in which a palladium film is stacked on a gold film) may be interposed between the bump electrode BE1 and the surface of the rewiring RM. Incidentally, a film thickness of the gold (Au) film may be set to about 0.03 to 0.2 μm, and a film thickness of the palladium (Pd) film may be set to about 0.1 to 0.2 μm.

The insulating film 17 is a dam for controlling the shape of the bump electrode BE1, which is provided to increase a ratio of a height (BH) with respect to a width (TD) of the bump electrode BE1 (referred to as an aspect ratio). When the dam is not provided, the bump electrode has an approximately spherical shape whose lower part is connected to the rewiring RM, and thus the aspect ratio of the bump electrode becomes less than 1, and does not become 1 or more. In the present embodiment, the aspect ratio of the bump electrode BE1 can be increased to 1 or more by providing the insulating film 17 (dam), and the following relational expression (Formula 1) is established.

$$BH/TD \geq 1 \quad \text{(Formula 1)}$$

In addition, since a width (TD) of the bump electrode BE1 exposed from the insulating film 17 can be decreased by increasing the film thickness of the insulating film 17 and a depth (DH) of the opening 17a of the insulating film 17, it is preferable that the depth (DH) of the opening 17a is made larger than ½ of the height (BH) of the bump electrode BE1, and the following relational expression (Formula 2) is established.

$$DH > \tfrac{1}{2} BH \quad \text{(Formula 2)}$$

Namely, the bump electrode BE1 is made up of a first part surrounded by the insulating film 17 and a second part exposed from the insulating film 17, and a height of the second part is smaller than a height of the first part. Further, a width of the first part is smaller than a width of the second part. Note that the width of the first part is a width of the bump electrode BE1 in the opening 17t, and the width of the second part corresponds to the width (TD) of the bump electrode BE1 and is a maximum width of the bump electrode BE1 exposed from the insulating film 17.

In addition, it is preferable to set the diameter (TR) of the opening 17t to be equal to or smaller than twice the depth (DH) of the opening 17a in order to make the bump electrode BE1 have a vertically long cross-sectional shape, and the following relational expression (Formula 3) is established.

$$TR \leq 2 \times DH \quad \text{(Formula 3)}$$

<Manufacturing Method of Semiconductor Device>

Figure 8:
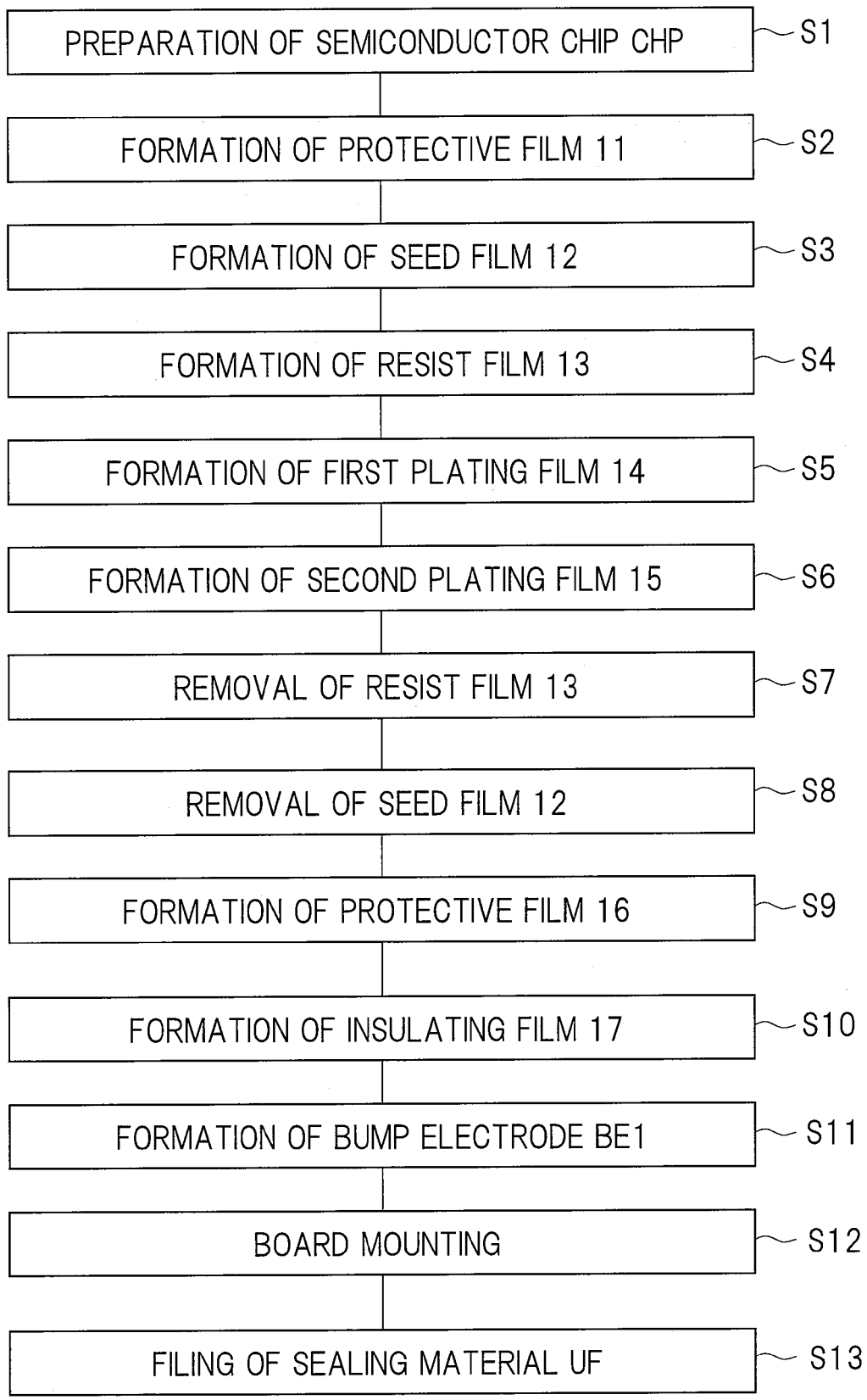
FIG. 8 is a process flow diagram showing a part of a manufacturing process of the semiconductor device according to the embodiment.

FIG. 8 is a process flow diagram showing a part of a manufacturing process of the semiconductor device according to the embodiment. FIGS. 9 to 15 are cross-sectional views showing a principal part in the manufacturing process of the semiconductor device according to the embodiment.

Figure 9:
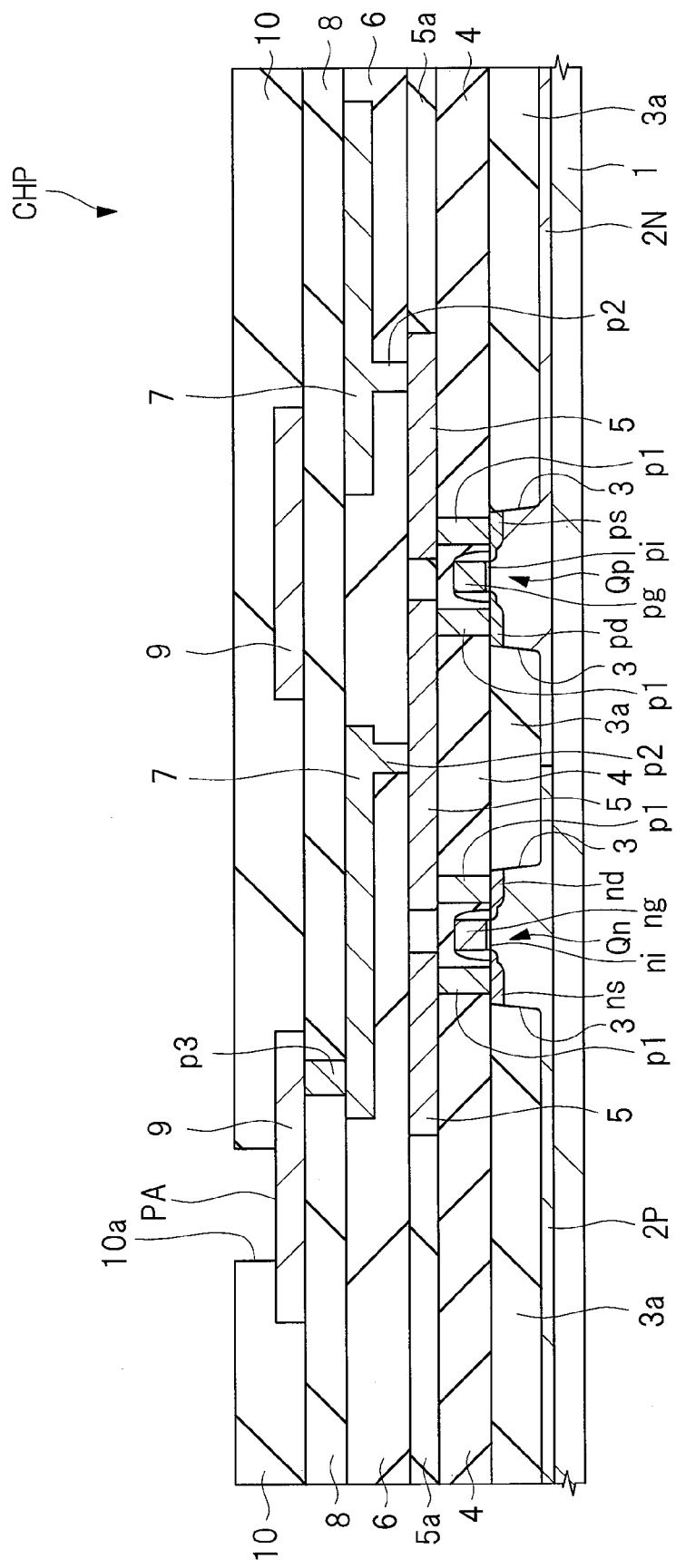
FIG. 9 is a cross-sectional view showing a principal part in the manufacturing process of the semiconductor device according to the embodiment.

As shown in FIG. 9, the semiconductor chip CHP having the pad electrode PA formed on the surface thereof is prepared (Step S1 in FIG. 8).

As shown in FIG. 9, a p-type well 2P, an n-type well 2N and an element isolation trench 3 are formed in the semiconductor substrate 1 made of, for example, p-type monocrystalline silicon, and an element isolation insulating film 3a made of, for example, a silicon oxide film is buried in the element isolation trench 3.

An n-channel MIS transistor (Qn) is formed in the p-type well 2P. The n-channel MIS transistor (Qn) is formed in an active region defined by the element isolation trench 3, and includes a source region ns and a drain region nd which are formed in the p-type well 2P and a gate electrode ng which is formed on the p-type well 2P with a gate insulating film ni interposed therebetween. In addition, a p-channel MIS transistor (Qp) is formed in the n-type well 2N. The p-channel MIS transistor (Qp) includes a source region ps, a drain region pd and a gate electrode pg which is formed on the n-type well 2N with a gate insulating film pi interposed therebetween.

A wiring which is made of metal films and connects semiconductor elements is formed in an upper part of the n-channel MIS transistor (Qn) and the p-channel MIS transistor (Qp). The wiring which connects the semiconductor elements has a multilayer wiring structure including about three to ten layers in general, and two wiring layers (first-layer Cu wiring 5 and second-layer Cu wiring 7) made of a metal film containing copper alloy as a main component and one wiring layer (third-layer Al wiring 9) made of a metal film containing Al alloy as a main component are shown in FIG. 9 as an example of the multilayer wiring. The term "wiring layer" is used in the case of collectively representing a plurality of wirings formed in the respective wiring layers. With respect to film thicknesses of the wiring layers, the wiring layer in the second layer is thicker than the wiring layer in the first layer, and the wiring layer in the third layer is thicker than the wiring layer in the second layer.

Interlayer insulating films 4, 6 and 8 made of silicon oxide films and plugs p1, p2 and p3 which electrically connect the wirings in the three layers to each other are formed between the n-channel MIS transistor (Qn) and the p-channel MIS transistor (Qn) and the first-layer Cu wiring 5, between the first-layer Cu wiring 5 and the second-layer Cu wiring 7, and between the second-layer Cu wiring 7 and the third-layer Al wiring 9, respectively.

For example, the interlayer insulating film 4 is formed on the semiconductor substrate 1 so as to cover the semiconductor elements, and the first-layer Cu wiring 5 is formed inside an insulating film 5a on the interlayer insulating film 4. The first-layer Cu wiring 5 is electrically connected to the source region ns, the drain region nd and the gate electrode ng of the n-channel MIS transistor (Qn) serving as the semiconductor elements through the plugs p1 formed in the interlayer insulating film 4, for example. In addition, the first-layer Cu wiring 5 is electrically connected to the source region ps, the drain region pd and the gate electrode pg of the p-channel MIS transistor (Qp) serving as the semiconductor elements through the plugs p1 formed in the interlayer insulating film 4. The connection between the gate electrodes ng and pg and the first-layer Cu wiring 5 is not illustrated. The plugs p1, p2 and p3 are made of metal films, for example, W (tungsten) films. The first-layer Cu wiring 5 is formed in a wiring trench of the insulating film 5a by a damascene method, and the first-layer Cu wiring 5 is configured to have a stacked structure including a barrier conductive film and a conductive film which is formed on the barrier conductive film and contains copper as a main component. The barrier conductive film is made of tantalum (Ta), titanium (Ti), ruthenium (Ru), tungsten (W), manganese (Mn), nitrides or silicide nitrides thereof, or a stacked film thereof. The conductive film containing copper as the main component is made of copper (Cu) or copper alloy (alloy containing copper (Cu) and aluminum (Al), magnesium (Mg), titanium (Ti), manganese (Mn), iron (Fe), zinc (Zn), zirconium (Zr), niobium (Nb), molybdenum (Mo), ruthenium (Ru), palladium (Pd), silver (Ag), gold (Au), In (indium), lanthanoid metal, actinoid metal or the like).

The second-layer Cu wiring 7 is electrically connected to the first-layer Cu wiring 5 through the plug p2 formed in the interlayer insulating film 6, for example. The third-layer Al wiring 9 is electrically connected to the second-layer Cu wiring 7 through the plug p3 formed in the interlayer insulating film 8, for example. The plug p3 is made of a metal film, for example, a W (tungsten) film.

The second-layer Cu wiring 7 is formed integrally with the plug p2 in the interlayer insulating film 6, and the second-layer Cu wiring 7 and the plug p2 are configured to have a stacked structure including a barrier conductive film and a conductive film which is formed on the barrier conductive film and contains copper as a main component. Further, the barrier conductive film and the conductive film containing copper as a main component are made of the same material as that of the first-layer Cu wiring 5.

In addition, it is preferable that a barrier insulating film which prevents the diffusion of copper is provided between the first-layer Cu wiring 5 and the interlayer insulating film 6 and between the second-layer Cu wiring 7 and the interlayer insulating film 8, and a SiCN film or a stacked film of a SiCN film and a SiCO film can be used as the barrier insulating film.

In addition, the third-layer Al wiring 9 is made of an aluminum alloy film (for example, an Al film in which Si and Cu are added), but may be formed as a Cu wiring.

Also, the interlayer insulating film 4 is made of a silicon oxide film ($SiO_2$), but it is a matter of course that the interlayer insulating film 4 may be configured of a monolayer film or a stacked film of a silicon oxide film containing carbon (SiOC film), a silicon oxide film containing nitrogen and carbon (SiCON film) and a silicon oxide film containing fluorine (SiOF film).

The surface protective film (protective film, insulating film) 10 which is made of a monolayer film of, for example, a silicon oxide film or a silicon nitride film or a two-layer film thereof is formed as a final passivation film on the third-layer Al wiring 9 which is the wiring layer in the uppermost layer of the multilayer wiring. Further, the third-layer Al wiring 9 which is the uppermost wiring layer exposed at a bottom portion of the pad opening (opening) 10a formed in the surface protective film 10 configures the pad electrode (pad, electrode pad) PA.

Figure 10:
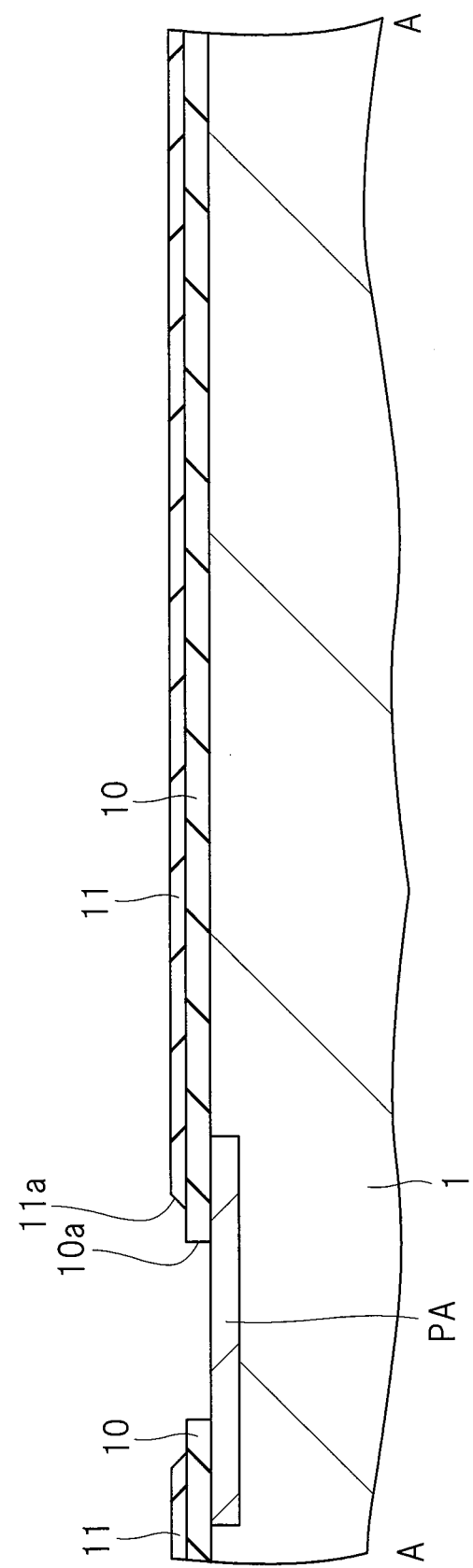
FIG. 10 is a cross-sectional view showing a principal part in the manufacturing process of the semiconductor device continued from FIG. 9.

Next, the protective film (organic insulating film) 11 is formed on the surface protective film 10 (Step S2 in FIG. 8) as shown in FIG. 10. Note that the wiring layer, the transistor and the like below the pad electrode PA are not shown in FIG. 10 and the subsequent drawings. Photosensitive polyimide resin is used as the protective film 11. The photosensitive polyimide applied onto the surface protective film 10 is subjected to exposure and development, thereby exposing the opening 10a and the pad electrode PA, and then the photosensitive polyimide is cured by heat treatment. In other words, the protective film 11 having the opening 11a larger than the opening 10a and the pad electrode PA is formed by patterning the photosensitive polyimide resin film. The openings 10a and 11a have a square shape when seen in a plan view.

Next, a seed film 12 is formed on the protective film 11 (Step S3 in FIG. 8). The seed film 12 has a stacked structure including a barrier film and a plating seed film on the barrier film. The barrier film is made of, for example, a titanium film (Ti film), a titanium nitride film (TiN film) and a titanium film (Ti film) which are formed by the sputtering method or the chemical vapor deposition (CVD) method and have film thicknesses of 10 nm, 50 nm and 10 nm, and the plating seed film is made of, for example, a copper (Cu) film which is formed by the sputtering method and has a film thickness of 200 nm. The seed film 12 is in contact with the upper surface of the pad electrode PA, and is formed on the sidewalls of the surface protective film 10 and the protective film 11 constituting the openings 10a and 11a and on the upper surfaces of the surface protective film 10 and the protective film 11.

Next, a resist film (insulating film, organic insulating film) 13 is formed on the seed film 12 (Step S4 in FIG. 8). A liquid resist or a dry film resist can be used as the resist film 13, and a film thickness thereof is set to, for example, 12 µm. The resist film 13 has an opening, and the opening of the resist film 13 includes the opening 11a and 10a.

Figure 11:
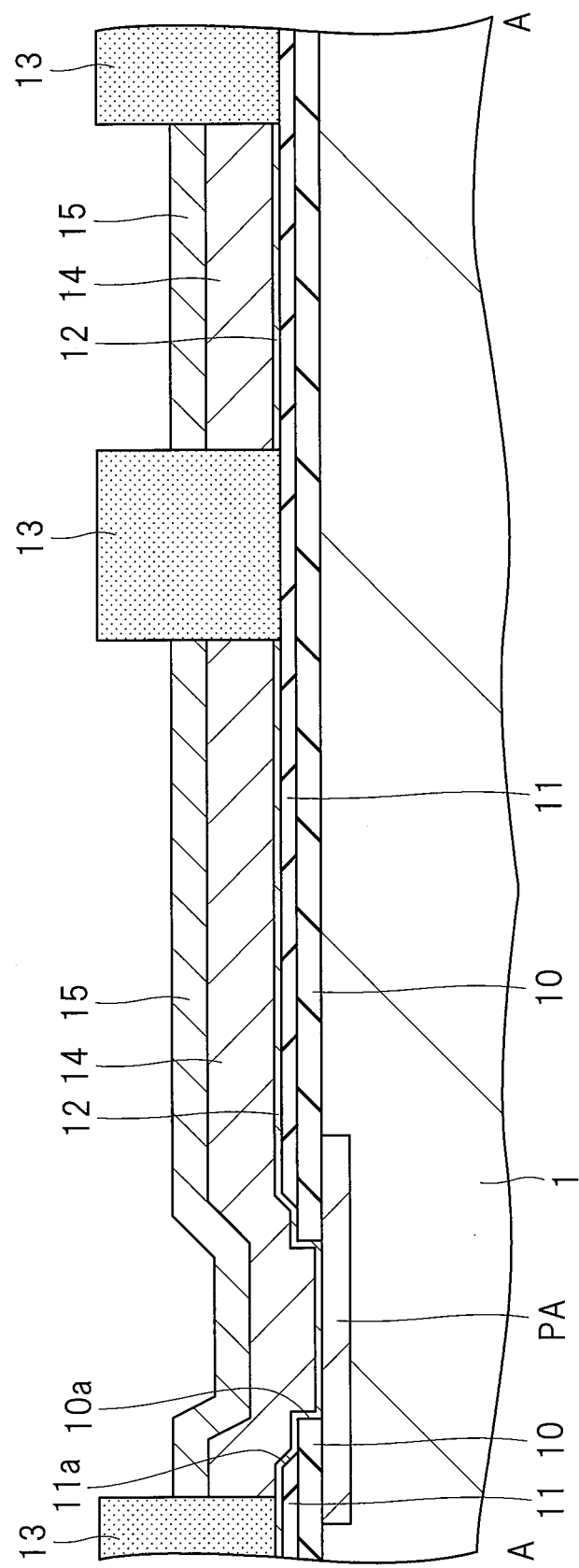
FIG. 11 is a cross-sectional view showing a principal part in the manufacturing process of the semiconductor device continued from FIG. 10.

Next, the plating film 14 is formed in the opening of the resist film 13, and then the plating film 15 is formed on the plating film 14 as shown in FIG. 11 (Steps S5 and S6 in FIG. 8). The plating film 14 and the plating film 15 are formed by the electrolytic plating method. In this electrolytic plating process, the seed film 12 functions as a seed layer. The plating film 14 is a copper (Cu) plating film, and the plating film 15 is a nickel (Ni) plating film. The plating film 14 completely fills the openings 10a and 11a. The resist film 13 is removed after forming the plating film 15 (Step S7 in FIG. 8).

Figure 12:
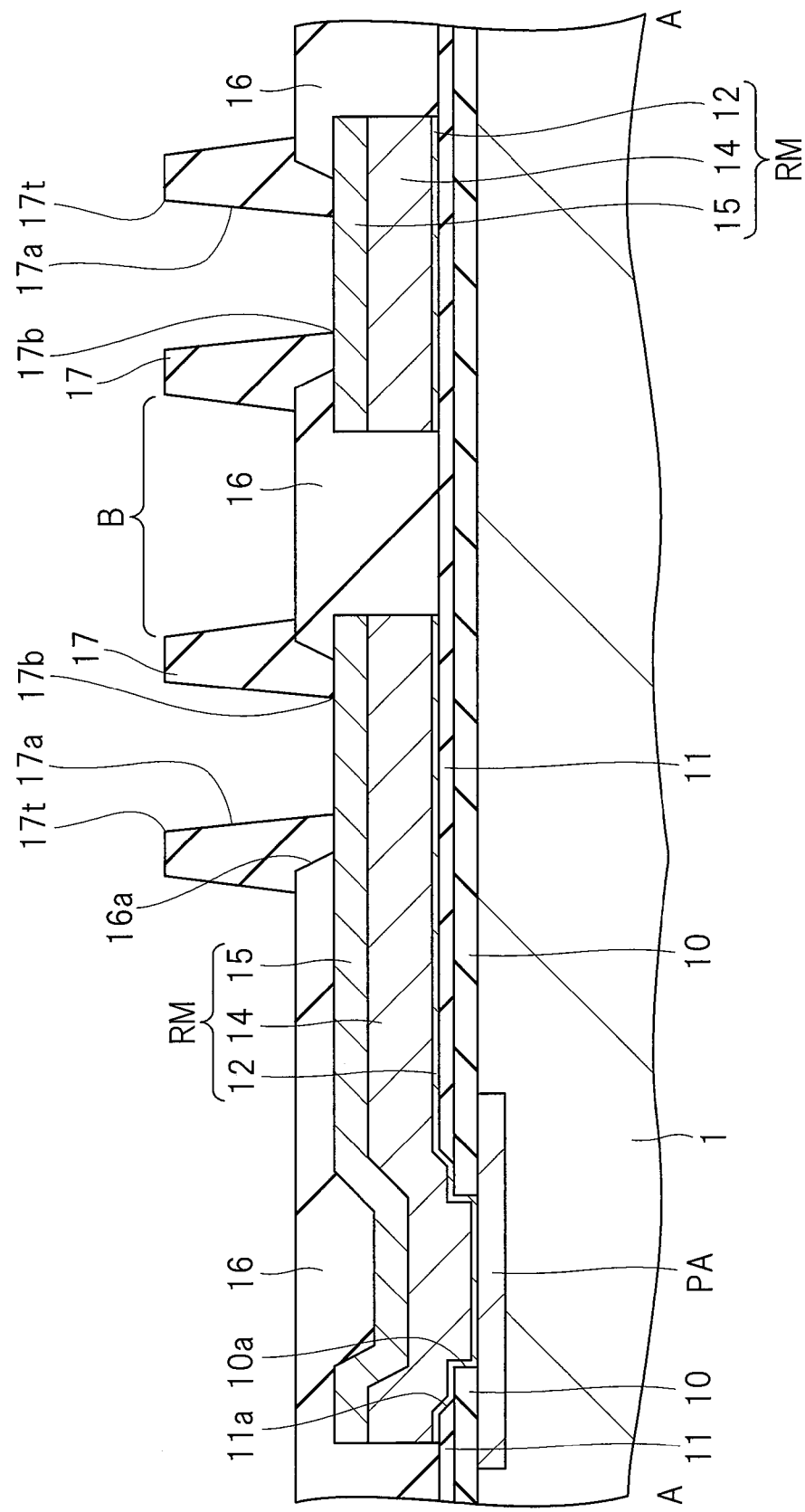
FIG. 12 is a cross-sectional view showing a principal part in the manufacturing process of the semiconductor device continued from FIG. 11.

Next, the seed film 12 is removed as shown in FIG. 12 (Step S8 in FIG. 8). Then, a wet etching process or the like is performed to the seed film 12 exposed by removing the resist film 13, thereby removing the seed film 12 in a region exposed from the plating films 14 and 15. In this manner, the rewiring RM which is made up of the plating film 15, the plating film 14 and the seed film 12 is formed.

Further, the protective film 16 is formed so as to cover the rewiring RM (Step S9 in FIG. 8). For example, photosensitive polyimide resin is used as the protective film 16. The photosensitive polyimide applied onto the rewiring RM is subjected to exposure, thereby forming the opening 16a which exposes a part of the rewiring RM, and then, the photosensitive polyimide is cured.

Next, the insulating film 17 which covers the part of the rewiring RM exposed through the opening 16a of the protective film 16 is formed (Step S10 in FIG. 8) as shown in FIG. 12. Photosensitive polyimide resin is used as the insulating film 17, for example. The photosensitive polyimide applied onto the protective film 16 and the rewiring RM is subjected to exposure and development, thereby forming the insulating film 17. The patterned insulating film 17 has an opening 17a that exposes a part of the rewiring RM, and has a ring-shaped pattern selectively left only around the opening 17a. Namely, the insulating film 17 is removed and the protective film 16 is exposed in the region B on the rewiring RM between the neighboring openings 17a. However, the insulating film 17 may be left in the region B between the neighboring openings 17a in order to prevent the protective film 16 from being removed by over etching and the rewiring RM from being exposed at the time of patterning the insulating film 17. The insulating film 17 having the same film thickness as the insulating film 17 that surrounds the opening 17a may be left in the region B, or the insulating film 17 having a film thickness smaller than that may be left therein. Namely, the insulating film 17 may be left to a degree that prevents the protective film 16 from being exposed in the region B. In addition, the patterning of the insulating film 17 may be performed after covering the surface of the protective film 16 with an insulating film such as a silicon nitride film in the region B.

Figure 13:
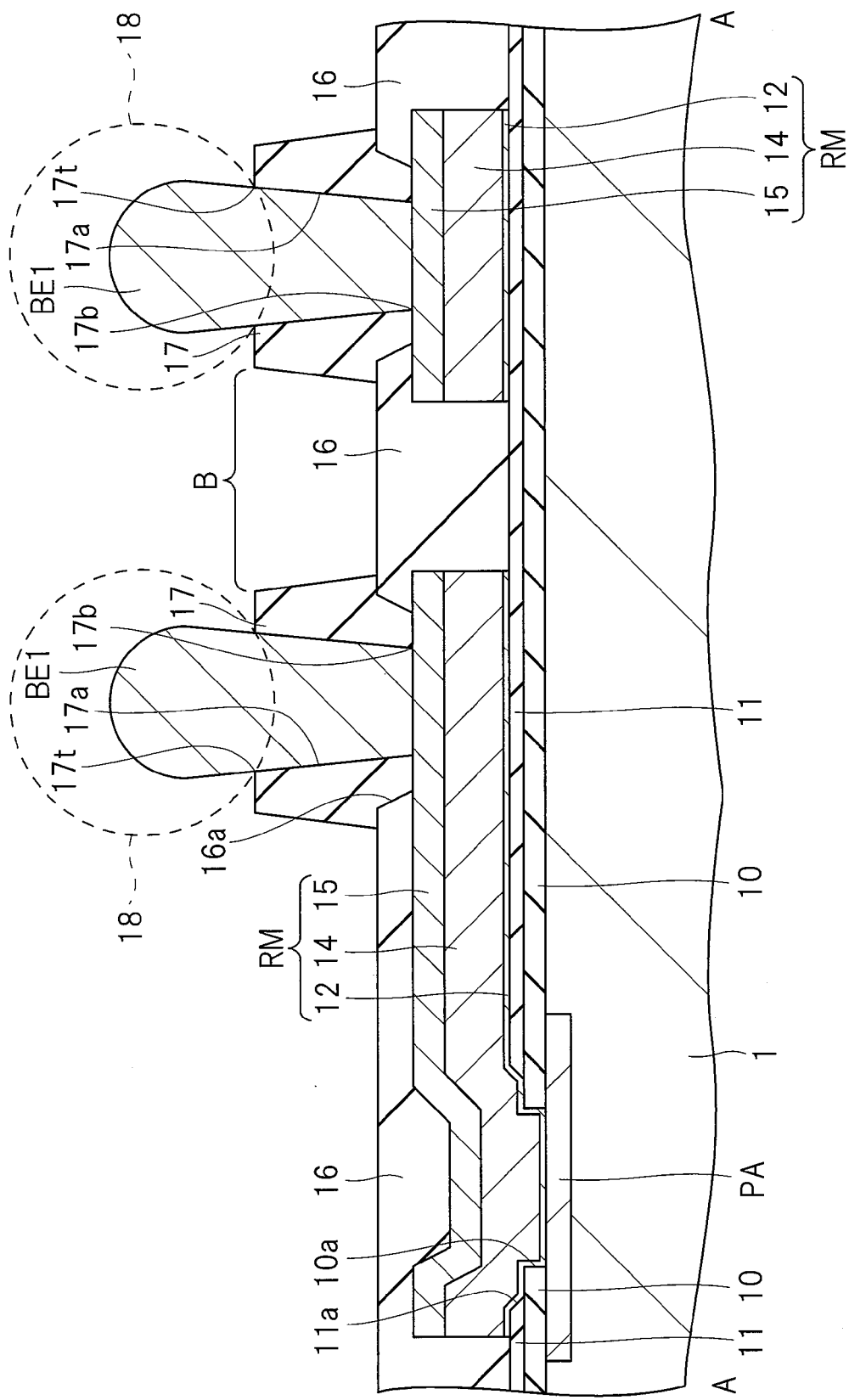
FIG. 13 is a cross-sectional view showing a principal part in the manufacturing process of the semiconductor device continued from FIG. 12.

Next, the bump electrode BE1 is formed as shown in FIG. 13 (Step S11 in FIG. 8). First, a solder ball 18 is supplied to the opening 17a of the insulating film 17. The solder ball 18 is a spherical lead-free solder material which is made of, for example, ternary alloy of tin, silver and copper, and a diameter thereof is 100 μm, 80 μm or 60 μm. The solder ball 18 has a diameter larger than that of the opening 17t, and one solder ball 18 is supplied to each of the openings 17a. Next, a reflow process (heat treatment) at, for example, 275° C. is performed to the solder ball 18 to melt the solder ball 18 and to cause solder to flow into the opening 17a of the insulating film 17, thereby forming the bump electrode BE1. The bump electrode BE1 is made up of a first part in the opening 17a and a second part above the opening 17a. Namely, it is important to use the solder ball 18 having a volume larger than a capacity of the opening 17a of the insulating film 17 so that the solder remains also above the opening 17a of the insulating film 17.

Note that the neighboring bump electrodes BE1 may be formed in different processes. In this case, for example, among the lines of the plurality of bump electrodes BE1 shown in FIG. 5 (for example, lines extending in the Y direction), the bump electrodes BE1 in odd lines are first formed, and the bump electrodes BE1 in even lines are formed thereafter. Specifically, after the solder balls 18 are arranged in the bump electrode mounting portions in the odd lines, the reflow is performed to form the bump electrodes BE1 in the odd lines, and thereafter, the bump electrodes BE1 in the even lines are formed through the similar steps. According to this method, it is possible to improve the mounting accuracy of the solder ball 18 on the opening 17a of the insulating film 17.

Figure 14:
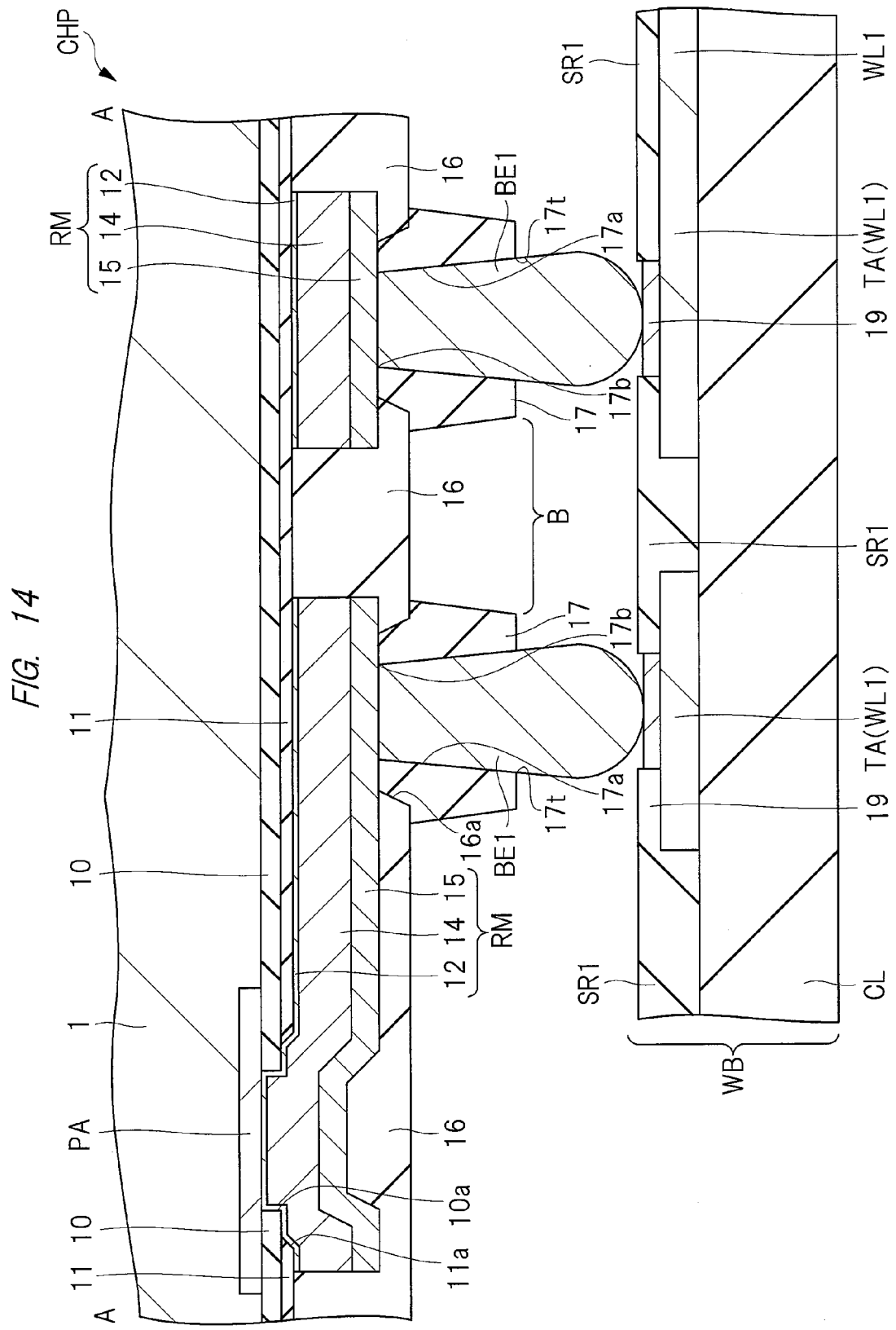
FIG. 14 is a cross-sectional view showing a principal part in the manufacturing process of the semiconductor device continued from FIG. 13.
Figure 15:
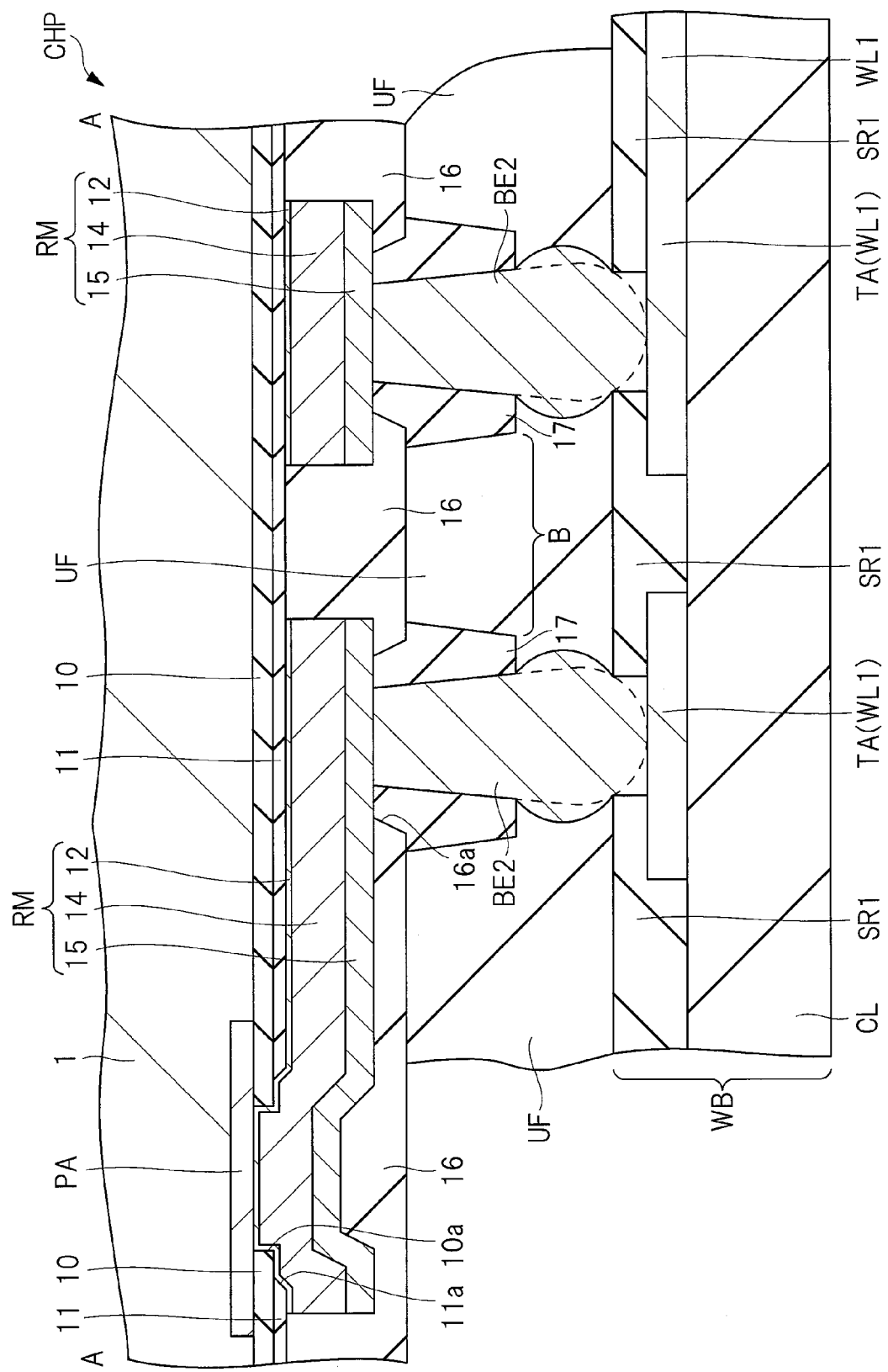
FIG. 15 is a cross-sectional view showing a principal part in the manufacturing process of the semiconductor device continued from FIG. 14.

Next, a board mounting process (Step S12 in FIG. 8) and a filling process of the sealing material UF (Step S13 in FIG. 8) are performed as shown in FIGS. 14 and 15. As shown in FIG. 14, the semiconductor chip CHP is mounted onto the wiring board WB so that the main surface of the semiconductor chip CHP opposes the front surface of the wiring board WB and the bump electrode BE1 and the terminal TA positionally correspond to each other. Here, a pre-solder 19 is formed on a surface of the terminal TA of the wiring board WB. The ternary lead-free solder material made of tin-silver-copper (Sn—Ag—Cu) can be used also as the pre-solder 19.

Next, as shown in FIG. 15, the semiconductor chip CHP and the wiring board WB are subjected to the reflow at, for example, 270 to 280° C., so that the rewiring RM and the terminal TA are connected by the bump electrode BE2 formed by melting the bump electrode BE1 and the pre-solder 19. Namely, the semiconductor chip CHP is connected to the wiring board WB by the bump electrode BE2.

Next, the sealing material UF is caused to flow into a gap between the main surface of the semiconductor chip CHP and the front surface of the wiring board WB and between the bump electrodes BE2, and thereafter, the heat treatment is performed to evaporate the solvent, thereby sealing the gap between the semiconductor chip CHP and the wiring board WB with the sealing material UF as shown in FIG. 15. The sealing material UF is in contact with the protective film 16 and the insulating film 17 of the semiconductor chip CHP and the solder resist film SR1 of the wiring board WB. Further, the sealing material UF is in contact with the entire periphery of the bump electrode BE2 and covers the bump electrode BE2. In other words, the sealing material UF completely covers the side surface of the bump electrode BE2 that is exposed from the insulating film 17 and the solder resist film SR1. The sealing material UF fills a space formed by the semiconductor chip CHP, the wiring board WB and the bump electrodes BE2 without any gap or void.

Here, the film thickness of the insulating film 17 (the film thickness on the protective film 16 or on the rewiring RM) is larger than the film thickness of the protective film 16 (the film thickness on the rewiring RM). According to this configuration, since it is possible to deepen the region B of FIG. 15, an inflow path (cross-sectional area of an inflow region) of the sealing material UF between the bump electrodes BE2 can be widened, and the generation of the void can be reduced.

In addition, the height of the bump electrode BE2 becomes about 80% of the height (BH) of the bump electrode BE1 after the board mounting, but the depth of the opening 17a of the insulating film is not changed, and thus, the above-described relational expression 2 is still established after the board mounting. Similarly, the above-described relational expression 3 is still established after the board mounting. In addition, it is preferable that the aspect ratio of the bump electrode BE2 is equal to or more than 1.

In addition, the bump electrode BE2 is made up of a first part surrounded by the insulating film 17 and a second part exposed from the insulating film 17, and it is preferable that a height of the second part is smaller than a height of the first part. Further, a width of the first part is smaller than a width of the second part. Note that the width of the first part is a width of the widest portion of the bump electrode BE2 in the opening 17a, and the width of the second part is a width of the widest portion of the bump electrode BE2 exposed from the insulating film 17.

The semiconductor device SA according to the present embodiment is completed through the above-described manufacturing process.

<Characteristics of Semiconductor Device According to Present Embodiment and Manufacturing Method Thereof>

In the semiconductor device SA according to the present embodiment, the bump electrode BE2 is made up of the first part whose periphery is surrounded by the insulating film 17 and the second part exposed (protruding) from the insulating film 17. According to this configuration, it is possible to decrease the width of the bump electrode BE2 while increasing the height of the bump electrode BE2 as compared to the case in which the insulating film 17 is not provided. In other words, it is possible to increase a distance between the neighboring bump electrodes BE2.

Since it is possible to mitigate the stress applied to the bump electrode BE2 due to the difference in coefficient of thermal expansion between the semiconductor chip CHP and the wiring board WB by increasing the height of the bump electrode BE2, it is possible to reduce the connection failure between the bump electrode BE2 and the semiconductor chip CHP and between the bump electrode BE2 and the wiring board WB. In addition, since the insulating film 17 is made of a polyimide film, it is possible to mitigate the stress applied to the bump electrode BE2.

Also, since the distance between the neighboring bump electrodes BE2 is increased, it is possible to prevent the short circuit between the neighboring bump electrodes BE2. Further, it is possible to prevent the generation of the void in the sealing material UF that fills the gap between the bump electrodes BE2.

In addition, the film thickness of the insulating film 17 is made larger than the film thickness of the protective film 16 that covers the rewiring RM in the semiconductor device SA according to the embodiment. Also, the insulating film 17 is formed in the ring shape around the bump electrode BE2. According to this configuration, it is possible to increase a contact area of the sealing material UF and the semiconductor chip CHP or the wiring board WB between the bump electrodes BE2, and thus the sealing strength can be improved.

In addition, in the manufacturing method of the semiconductor device SA according to the present embodiment, the solder ball 18 is placed on the opening 17a in the center portion of the insulating film 17, and then, the reflow is performed to form the bump electrode BE1 having the first part surrounded by the insulating film 17 and the second part exposed from the insulating film 17. Thereafter, the bump electrode BE1 is connected to the terminal TA of the wiring board WB to form the bump electrode BE2, and the sealing material UF is supplied to fill the gap between the bump electrodes BE2.

According to the above-described manufacturing method, since it is possible to increase the cross-sectional area of the inflow path of the sealing material UF at the time of supplying the sealing material UF to fill the gap between the bump electrodes BE2, it is possible to prevent the generation of the void in the sealing material UF, and the connection reliability between the bump electrode BE2 and the semiconductor chip CHP and between the bump electrode BE2 and the wiring board WB can be improved. Herein, the expression "in the sealing material UF" includes an interface between the sealing material UF and the bump electrode BE2 and an interface between the sealing material UF and the wiring board WB or the semiconductor chip CHP.

In addition, since the insulating film 17 is selectively formed only around the bump electrode BE1 on the protective film 16, it is possible to increase the cross-sectional area of the inflow path of the sealing material UF. In addition, the film thickness of the insulating film 17 is made larger than the film thickness of the protective film 16, and thus, it is possible to further increase the cross-sectional area of the inflow path of the sealing material UF. Accordingly, it is possible to prevent the generation of the void in the sealing material UF.

Note that the above-described embodiment has the structure in which the rewiring RM is connected to the pad electrode PA and the bump electrode BE1 is formed at the end portion of the rewiring RM, but the insulating film 17 according to the present embodiment may be applied at the time of forming the bump electrode BE1 on the pad electrode PA via a barrier metal layer without using the rewiring RM.

Modification Example 1

Figure 16:
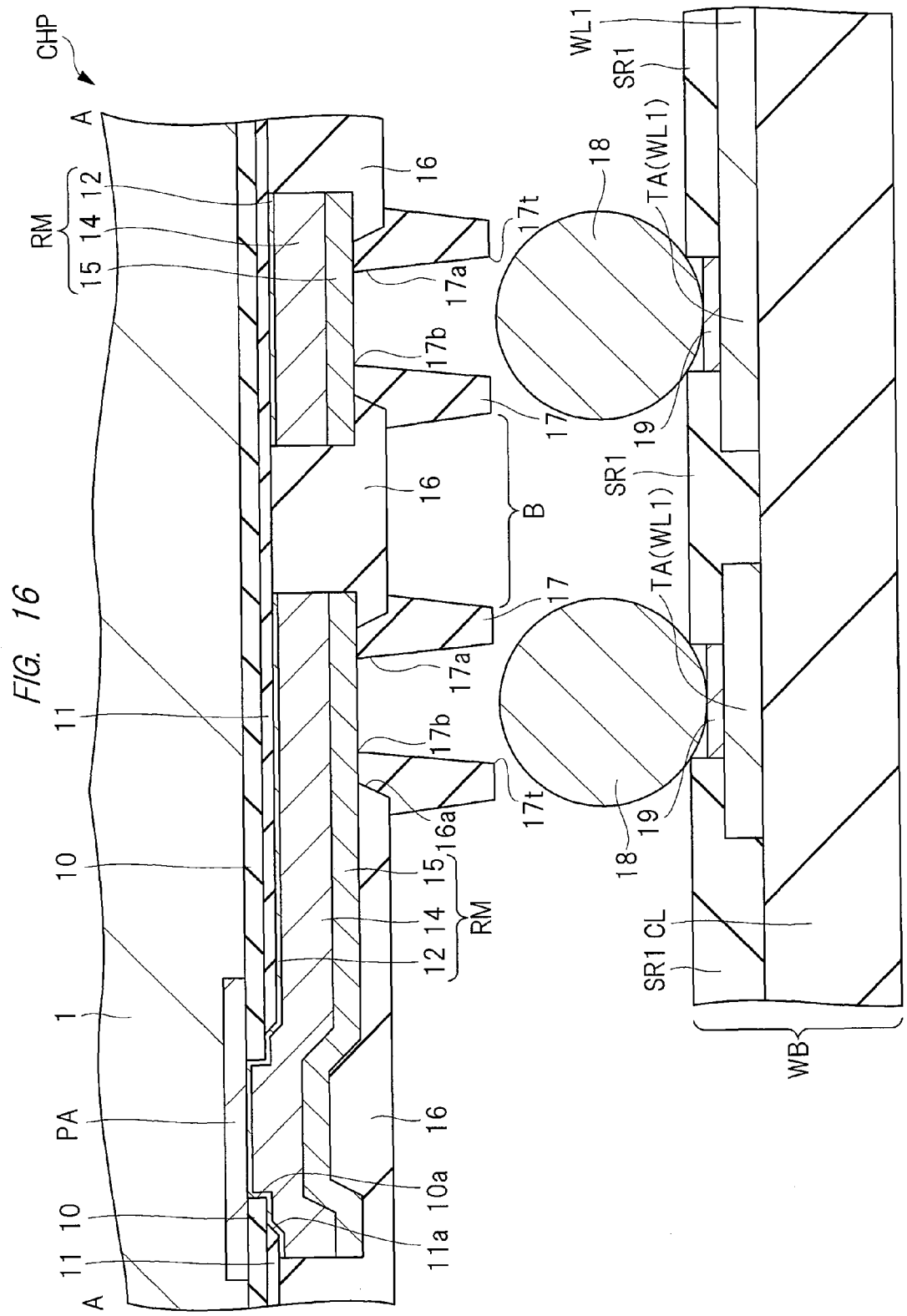
FIG. 16 is a cross-sectional view showing a principal part of a manufacturing process of a semiconductor device of Modification Example 1.

The modification Example 1 is a modification example of the above-described embodiment and is different from the above-described embodiment in that the board mounting is carried out after mounting a solder ball on a wiring board. FIG. 16 is a cross-sectional view showing a principal part in a manufacturing process of a semiconductor device of the Modification Example 1.

After Steps S1 to S10 in the process flow diagram shown in FIG. 8 are executed, board mounting corresponding to Step S12 is executed without executing Step S11. At this time, the solder ball 18 is arranged on the terminal TA of the wiring board WB as shown in FIG. 16 without forming the bump electrode BE1 on the semiconductor chip CHP. Then, Step S13 is executed after the semiconductor chip CHP is arranged on the wiring board WB and the reflow is carried out, so that the semiconductor device according to the Modification Example 1 having the similar structure as the semiconductor device in FIG. 15 is completed.

According to the Modification Example 1, since it is possible to omit the process of forming the bump electrode BE1 (Step S11) of FIG. 8, the manufacturing method can be simplified. Further, since it is possible to omit the reflow process, the thermal load to the semiconductor chip CHP can be reduced.

In addition, the bump electrode BE2 shown in FIG. 15 is formed when the solder ball 18 is melted and flows into the opening 17a of the insulating film 17 in the reflow process of the board mounting. According to this manufacturing method, the semiconductor chip CHP and the wiring board WB are positioned in a self-aligned manner.

Modification Example 2

Figure 17:
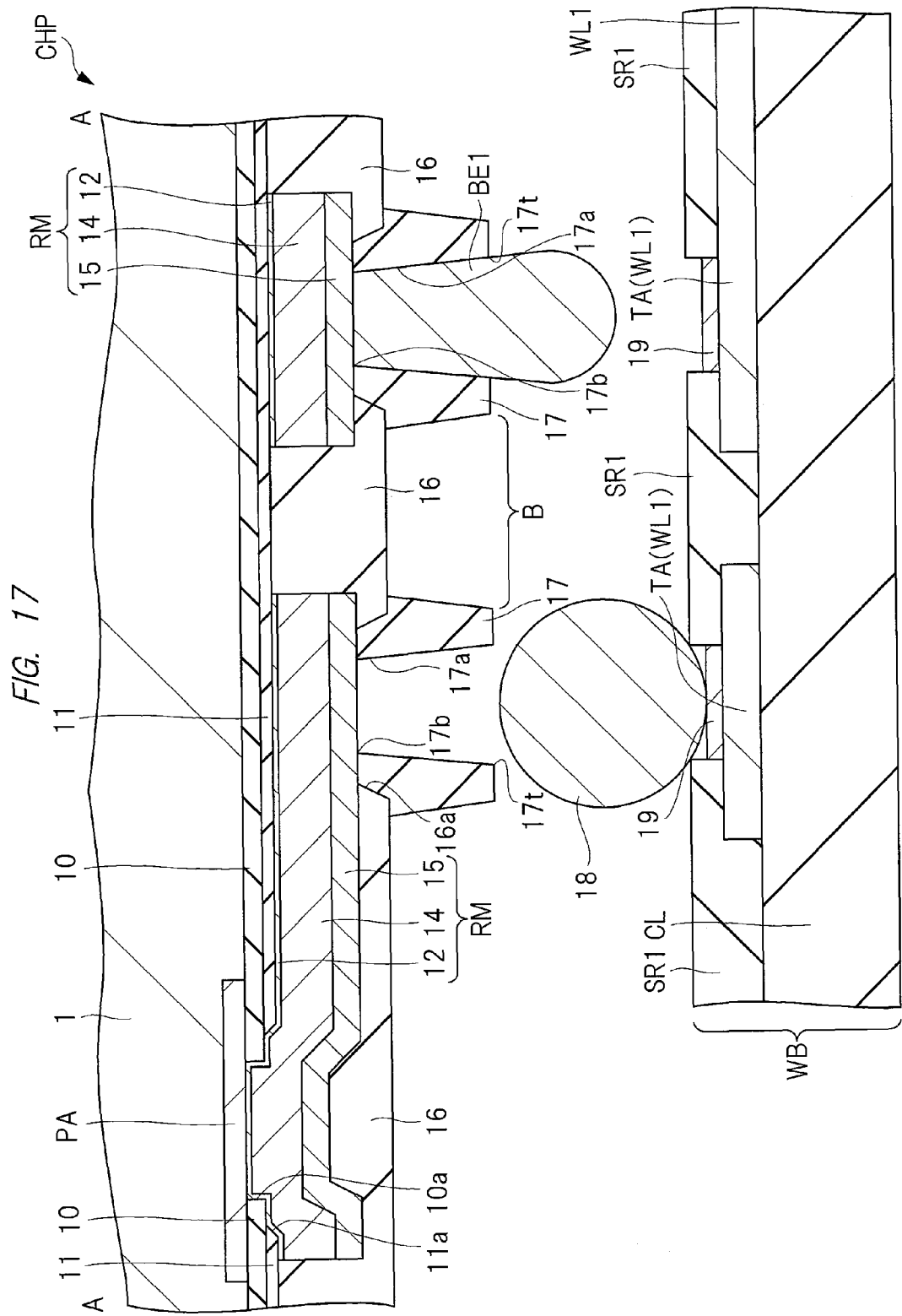
FIG. 17 is a cross-sectional view showing a principal part of a manufacturing process of a semiconductor device of Modification Example 2.

The Modification Example 2 is a modification example of the above-described embodiment, and corresponds to the example in which the above-described embodiment and the Modification Example 1 are combined. FIG. 17 is a cross-sectional view showing a principal part in a manufacturing process of a semiconductor device of the Modification Example 2.

The bump electrodes BE1 in the odd lines in the X direction of FIG. 5 are formed in the same manner as the above-described embodiment. Then, the bump electrodes BE2 in the even lines are formed according to the method of the Modification Example 1. Namely, Steps S1 to S11 in FIG. 8 are executed to prepare the bump electrodes BE1 in the odd lines of the semiconductor chip CHP. Further, the wiring board WB in which the solder balls 18 are arranged on the terminals TA of the wiring board WB corresponding to the bump electrode mounting portions in the even lines of the semiconductor chip CHP is prepared. Next, the semiconductor chip CHP is mounted on the wiring board WB and the reflow is carried out, thereby executing the board mounting process. Then, the filling process of the sealing material UF (Step S13) of FIG. 8 is executed, so that the semiconductor device according to the Modification Example 2 having the similar structure as the semiconductor device in FIG. 15 is manufactured.

Modification Example 3

Figure 18:
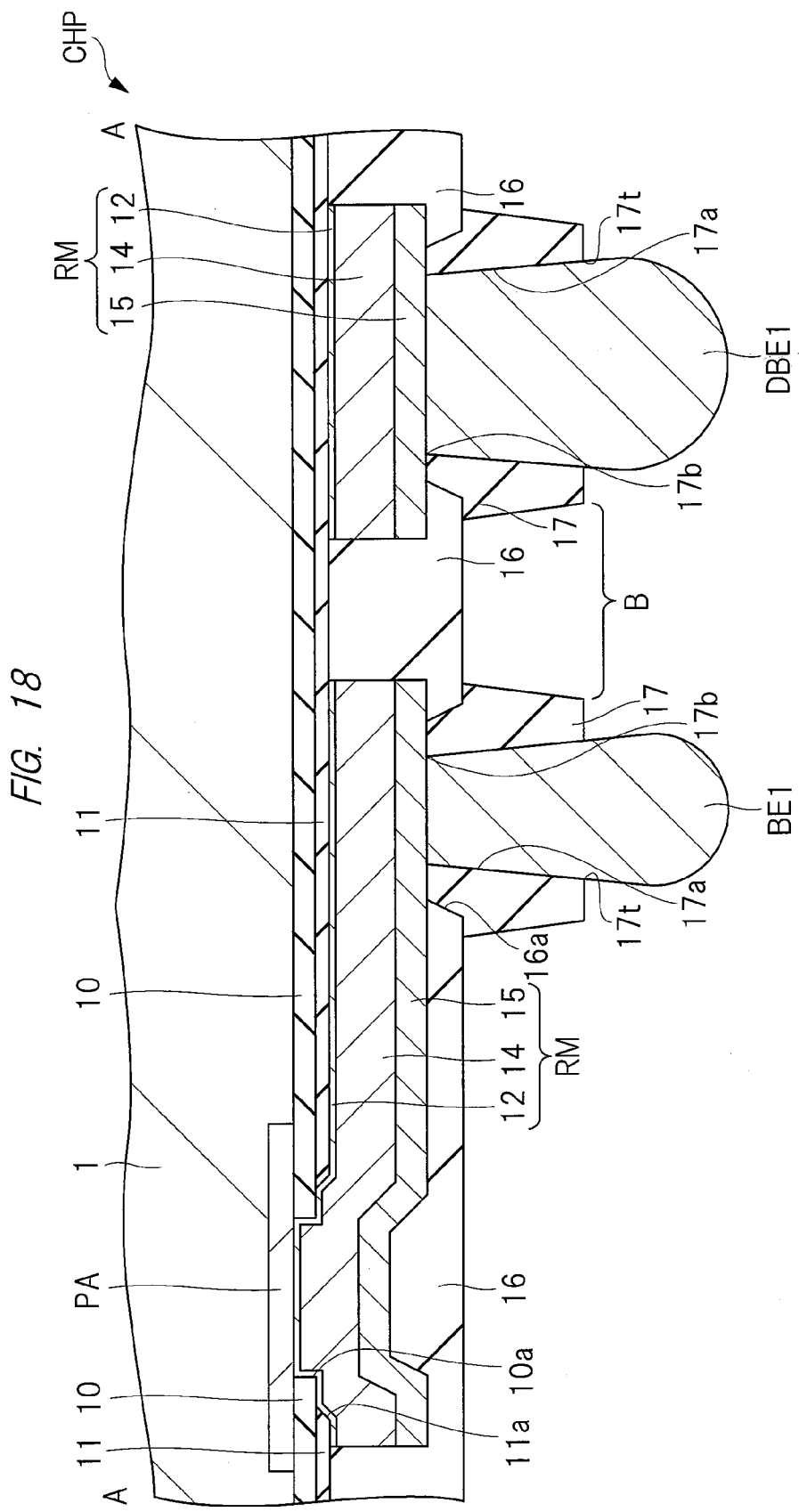
FIG. 18 is a cross-sectional view showing a principal part of a manufacturing process of a semiconductor device of Modification Example 3.
Figure 19:
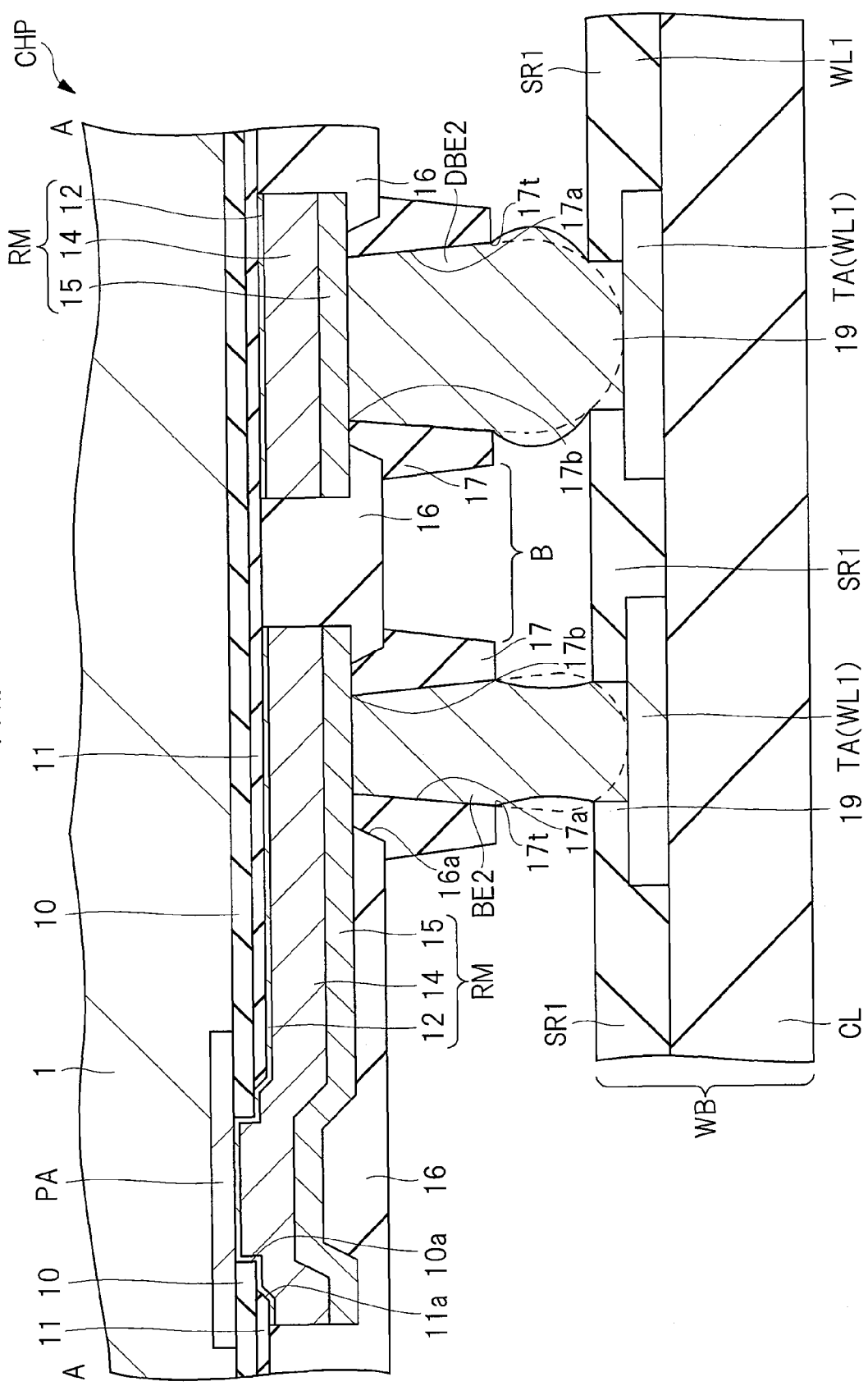
FIG. 19 is a cross-sectional view showing a principal part in the manufacturing process of the semiconductor device continued from FIG. 18.

The Modification Example 3 is a modification example of the above-described embodiment and is different from the above-described embodiment in that the dummy bump electrode DBE1 is arranged at the corner portion of the semiconductor chip CHP. FIGS. 18 and 19 are cross-sectional views showing a principal part in a manufacturing process of a semiconductor device of the Modification Example 3.

As shown in FIG. 5, the dummy bump electrode DBE1 is arranged at each of the four corner portions of the semiconductor chip CHP. The dummy bump electrode DBE1 is larger than the bump electrode BE1, and the area thereof is about 1.5 times the area of the bump electrode BE1.

The semiconductor device according to the Modification Example 3 is completed by executing Steps S1 to S13 of FIG. 8, but the dummy bump electrode DBE1 is formed from the two solder balls 18 in the process of forming the bump electrode BE1 in Step S11. As shown in FIG. 18, a width of the dummy bump electrode DBE1 in the long-axis or short-axis direction is larger than that of the bump electrode BE1.

Next, Steps S12 and S13 are executed, but since the volume of the dummy bump electrode DBE1 is larger than that of the bump electrode BE1, the gap between the semiconductor chip CHP and the wiring board WB can be determined by a height of the dummy bump electrode DBE2. Namely, the gap between the semiconductor chip CHP and the wiring board WB is larger in the Modification Example 3 than in the case of the above-described embodiment. In this manner, since the cross-sectional shape of the bump electrode BE2 can be changed from a drum shape to an hourglass shape, it is possible to further improve a margin for short-circuit between the neighboring bump electrodes BE1.

In addition, since the dummy bump electrode DBE2 with the large width is arranged at the corner portion of the semiconductor chip CHP and the cross-sectional shape of the bump electrode BE2 is changed to the hourglass shape, the effect of mitigating the stress can be further improved.

In the foregoing, the invention made by the inventor of the present invention has been concretely described based on the embodiments. However, it is needless to say that the present invention is not limited to the foregoing embodiments and various modifications and alterations can be made within the scope of the present invention.

In addition, some of the contents described in the above-described embodiment will be described below.

APPENDIX 1

A manufacturing method of a semiconductor device includes the steps of:
(a) preparing a semiconductor substrate having a first conductive layer and a second conductive layer which are formed on a main surface thereof and a first insulating film which covers the first conductive layer and the second conductive layer;
(b) forming a second insulating film which covers the first insulating film and has a first opening which exposes a surface of the first conductive layer and a second opening which exposes a surface of the second conductive layer;
(c) arranging a first solder ball in the first opening and a second solder ball in the second opening and performing heat treatment to the first solder ball and the second solder ball, thereby forming a first bump electrode made up of a first part in the first opening and a second part on the first opening and a second bump electrode made up of a third part in the second opening and a fourth part on the second opening; and
(d) connecting the first bump electrode to a first terminal of a wiring board and the second bump electrode to a second terminal of the wiring board.

APPENDIX 2

The manufacturing method of a semiconductor device described in Appendix 1 further includes the step of:
(e) filling a gap between the semiconductor substrate and the wiring board with a sealing material, and
the sealing material is supplied so as to fill a gap between the first bump electrode and the second bump electrode.

APPENDIX 3

In the manufacturing method of a semiconductor device described in Appendix 1, the second insulating film is partially removed in a region between the first opening and the second opening in the step (b).

APPENDIX 4

In the manufacturing method of a semiconductor device described in Appendix 1, the step (c) includes the steps of:
(c1) arranging the first solder ball in the first opening and performing first heat treatment to the first solder ball, thereby forming the first bump electrode; and
(c2) arranging the second solder ball in the second opening and performing second heat treatment different from the first heat treatment to the second solder ball, thereby forming the second bump electrode.

APPENDIX 5

A manufacturing method of a semiconductor device includes the steps of:
(a) preparing a semiconductor substrate having a first conductive layer and a second conductive layer which are formed on a main surface thereof and a first insulating film which covers the first conductive layer and the second conductive layer;
(b) forming a second insulating film which covers the first insulating film and has a first opening which exposes a surface of the first conductive layer and a second opening which exposes a surface of the second conductive layer;

(c) preparing a wiring board in which a first solder ball is arranged on a first terminal and a second solder ball is arranged on a second terminal, the terminals being formed on a surface of the wiring board; and (d) arranging the semiconductor substrate on the wiring board and melting the first solder ball and the second solder ball by performing heat treatment, thereby forming a first bump electrode which connects the first conductive layer and the first terminal and a second bump electrode which connects the second conductive layer and the second terminal.

APPENDIX 6

The manufacturing method of a semiconductor device described in Appendix 5 further includes the step of:

(e) filling a gap between the semiconductor substrate and the wiring board with a sealing material, and the sealing material is supplied so as to fill a gap between the first bump electrode and the second bump electrode.

APPENDIX 7

A manufacturing method of a semiconductor device includes the steps of:

(a) preparing a semiconductor substrate having a first conductive layer and a second conductive layer which are formed on a main surface thereof and a first insulating film which covers the first conductive layer and the second conductive layer;

(b) forming a second insulating film which covers the first insulating film and has a first opening which exposes a surface of the first conductive layer and a second opening which exposes a surface of the second conductive layer;

(c) arranging a first solder ball in the first opening and performing heat treatment to the first solder ball, thereby forming a first bump electrode made up of a first part in the first opening and a second part on the first opening;

(d) preparing a wiring board which has a first terminal and a second terminal formed on a surface thereof and in which a second solder ball is arranged on the second terminal; and (e) arranging the semiconductor substrate on the wiring board and performing heat treatment, thereby connecting the first bump electrode to the first terminal of the wiring board and melting the second solder ball to form a second bump electrode which connects the second conductive layer and the second terminal.

APPENDIX 8

The manufacturing method of a semiconductor device described in Appendix 7 further includes the step of:

(f) filling a gap between the semiconductor substrate and the wiring board with a sealing material, and the sealing material is supplied so as to fill a gap between the first bump electrode and the second bump electrode.

What is claimed is:

1. A semiconductor device comprising:
a semiconductor substrate;
a conductive layer formed on the semiconductor substrate;
a first insulating film which is formed on the conductive layer and covers the conductive layer;
a second insulating film which is formed on the first insulating film and includes an opening which exposes a part of a surface of the conductive layer;
a bump electrode which is made up of a first part which is in contact with the conductive layer and positioned in the opening and a second part which is positioned on the opening and exposed from the second insulating film;
a terminal which is connected to the bump electrode and is formed on a surface of a wiring board; and
a sealing material which fills a gap between the semiconductor substrate and the wiring board,
wherein the sealing material is in contact with the first insulating film on an outer side of the second insulating film which covers the periphery of the first part of the bump electrode.

2. The semiconductor device according to claim 1, wherein a height of the first part is larger than a height of the second part.

3. The semiconductor device according to claim 1, wherein a width of the first part is smaller than a width of the second part.

4. The semiconductor device according to claim 1, wherein the second insulating film covers a periphery of the first part of the bump electrode.

5. The semiconductor device according to claim 4, wherein a film thickness of the second insulating film is larger than a film thickness of the first insulating film.

6. The semiconductor device according to claim 1, wherein the sealing material covers a periphery of the second part of the bump electrode and is in contact with a side surface of the second part.

7. The semiconductor device according to claim 1 further comprising:
a third insulating film which covers the surface of the wiring board and exposes the terminal.

8. The semiconductor device according to claim 7, wherein the sealing material is in contact with the third insulating film.

9. The semiconductor device according to claim 1 further comprising:
a pad electrode provided on the semiconductor substrate, wherein the conductive layer is connected to the pad electrode.

10. The semiconductor device according to claim 9, wherein a film thickness of the conductive layer is larger than a film thickness of the pad electrode.

11. The semiconductor device according to claim 1, wherein the second insulating film is made of a polyimide film.

12. The semiconductor device according to claim 1, wherein the first insulating film is made of a polyimide film.

13. The semiconductor device according to claim 1, wherein the bump electrode is made of ternary alloy containing tin, silver and copper.

14. The semiconductor device according to claim 1, wherein the semiconductor substrate has a rectangular shape,
the semiconductor device further comprising: a dummy bump electrode that is arranged at a corner portion of the semiconductor substrate.

* * * * *